(12) United States Patent
Mack et al.

(10) Patent No.: US 9,869,938 B2
(45) Date of Patent: Jan. 16, 2018

(54) PHOTONIC ACTIVATION OF REACTANTS FOR SUB-MICRON FEATURE FORMATION USING DEPLETED BEAMS

(71) Applicant: Applied Materials, Inc., Santa Clara, CA (US)

(72) Inventors: James Francis Mack, Woodside, CA (US); Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 80 days.

(21) Appl. No.: 14/452,200

(22) Filed: Aug. 5, 2014

(65) Prior Publication Data

US 2015/0042973 A1  Feb. 12, 2015

Related U.S. Application Data

(60) Provisional application No. 61/884,744, filed on Sep. 30, 2013, provisional application No. 61/863,740, filed on Aug. 8, 2013.

(51) Int. Cl.
*G03B 27/54* (2006.01)
*G03F 7/20* (2006.01)

(52) U.S. Cl.
CPC .......... *G03F 7/704* (2013.01); *G03F 7/70375* (2013.01); *G03F 7/70383* (2013.01)

(58) Field of Classification Search
CPC ... G03F 7/704; G03F 7/70375; G03F 7/70383
See application file for complete search history.

(56) References Cited

U.S. PATENT DOCUMENTS 7,528,380 B1 * 5/2009 Mirell .................... B82Y 10/00
                                                        250/396 R
2002/0167326 A1   11/2002 Borden et al.
(Continued)

FOREIGN PATENT DOCUMENTS

EP          2620249 A1      7/2013

OTHER PUBLICATIONS

International Search Report and Written Opinion for Application No. PCT/US2014/048186 dated Nov. 13, 2014; 9 Total Pages.
(Continued)

*Primary Examiner* — Deoram Persaud
(74) *Attorney, Agent, or Firm* — Patterson + Sheridan LLP

(57) ABSTRACT

A fine feature formation method and apparatus provide photon induced deposition, etch and thermal or photon based treatment in an area of less than the diameter or cross section of a STED depleted laser beam. At least two STED depleted beams are directed to a reaction location on a substrate where a beam overlap region having an area smaller than the excitation portion of the beams is formed. A reactant or reactants introduced to the reaction region is excited by the combined energy of the excitation portions of the two beams, but not excited outside of the overlap region of the two excitation portions of the beams. A reactant is caused to occur only in the overlap region. The overlap region may be less that 20 nm wide, and less than 1 nm in width, to enable the formation of substrate features, or the change in the substrate, in a small area.

22 Claims, 19 Drawing Sheets

(56) References Cited

U.S. PATENT DOCUMENTS

| | | | | |
|---|---|---|---|---|
| 2005/0059681 | A1* | 3/2005 | Cremer | G01N 21/6428 514/260.1 |
| 2006/0183059 | A1* | 8/2006 | Menon | G03F 7/203 430/322 |
| 2008/0003525 | A1* | 1/2008 | Amaya | G03F 7/70466 430/311 |
| 2008/0018891 | A1* | 1/2008 | Hell | G01N 21/6458 356/317 |
| 2008/0099667 | A1* | 5/2008 | Stark | G01N 21/648 250/227.18 |
| 2008/0108229 | A1 | 5/2008 | Tanaka et al. | |
| 2009/0173893 | A1 | 7/2009 | Tanaka et al. | |
| 2009/0294694 | A1* | 12/2009 | Lippert | G01N 21/6458 250/461.1 |
| 2011/0039213 | A1* | 2/2011 | Fourkas | G03B 27/72 430/322 |
| 2012/0069332 | A1 | 3/2012 | Frankel | |
| 2012/0092632 | A1* | 4/2012 | McLeod | G03F 7/031 355/53 |
| 2012/0292531 | A1* | 11/2012 | Grudinin | G01N 21/6458 250/459.1 |
| 2012/0325784 | A1* | 12/2012 | Moffatt | B23K 26/03 219/121.61 |
| 2013/0077315 | A1* | 3/2013 | Moffatt | G02B 27/48 362/259 |
| 2013/0183833 | A1* | 7/2013 | Duan | B23K 26/0613 438/778 |
| 2014/0256161 | A1* | 9/2014 | Li | H01L 21/268 438/795 |
| 2016/0139050 | A1* | 5/2016 | Wuite | B01L 3/502761 436/94 |
| 2016/0274439 | A1* | 9/2016 | Bianchini | G02B 21/002 |

OTHER PUBLICATIONS

Netherlands Search Report and Written Opinion for Application No. 2013299 dated Dec. 2, 2015; 11 Total Pages.

Hemmer, Philip R., "Secrets of subwavelength imaging and lithography," Proc. of SPIE, vol. 8163, 816303-1-816303-6, downloaded from http://proceedings.spiedigitallibrary.org/ on Jun. 19, 2013.

Tischer, Joachim et al., "Three-dimensional optical laser lithography beyond the diffraction limit," Laser Photonics Rev. 7, No. 1 (2013), pp. 22-44.

* cited by examiner

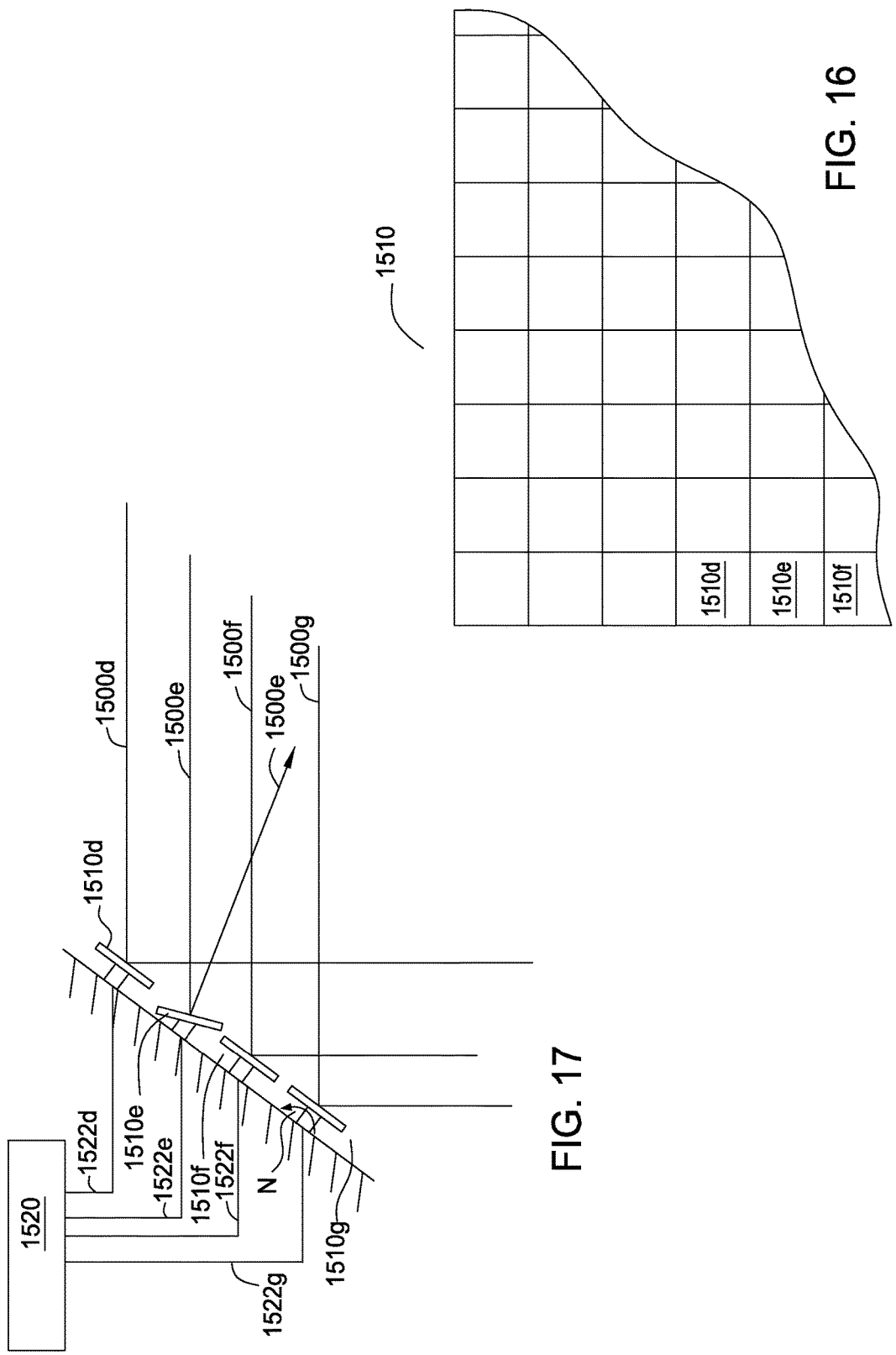

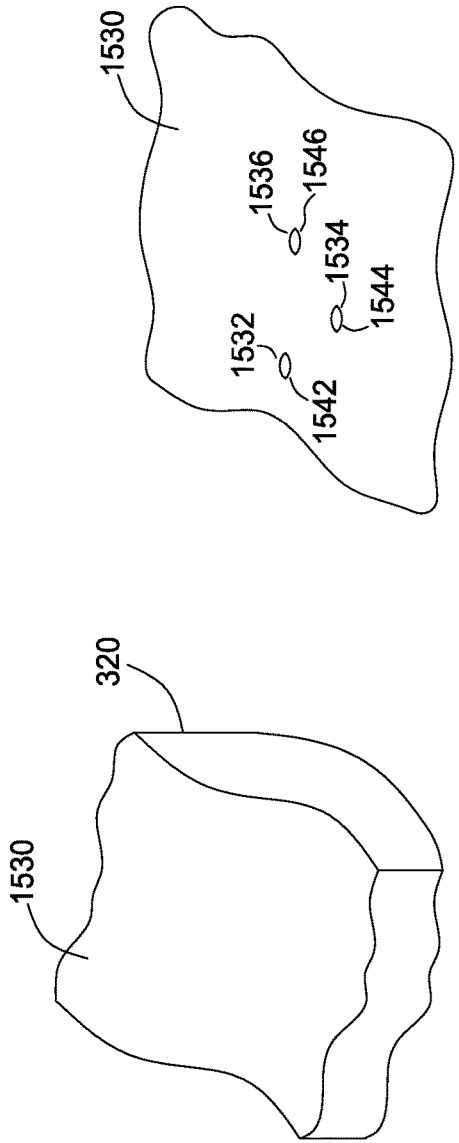
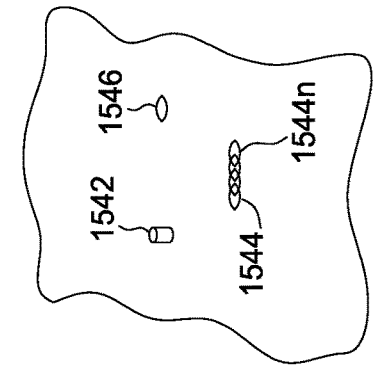
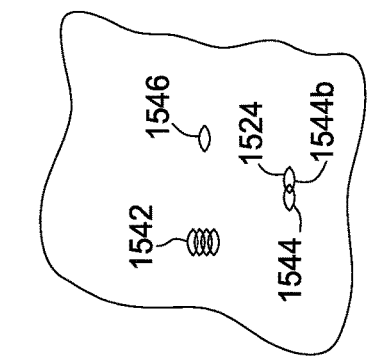
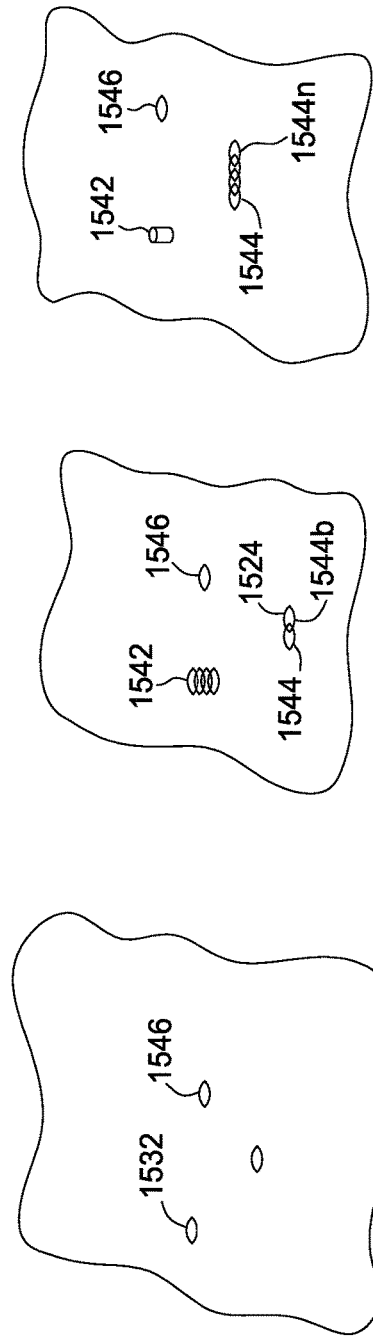
FIG. 18A
FIG. 18B
FIG. 18C
FIG. 18D
FIG. 18E

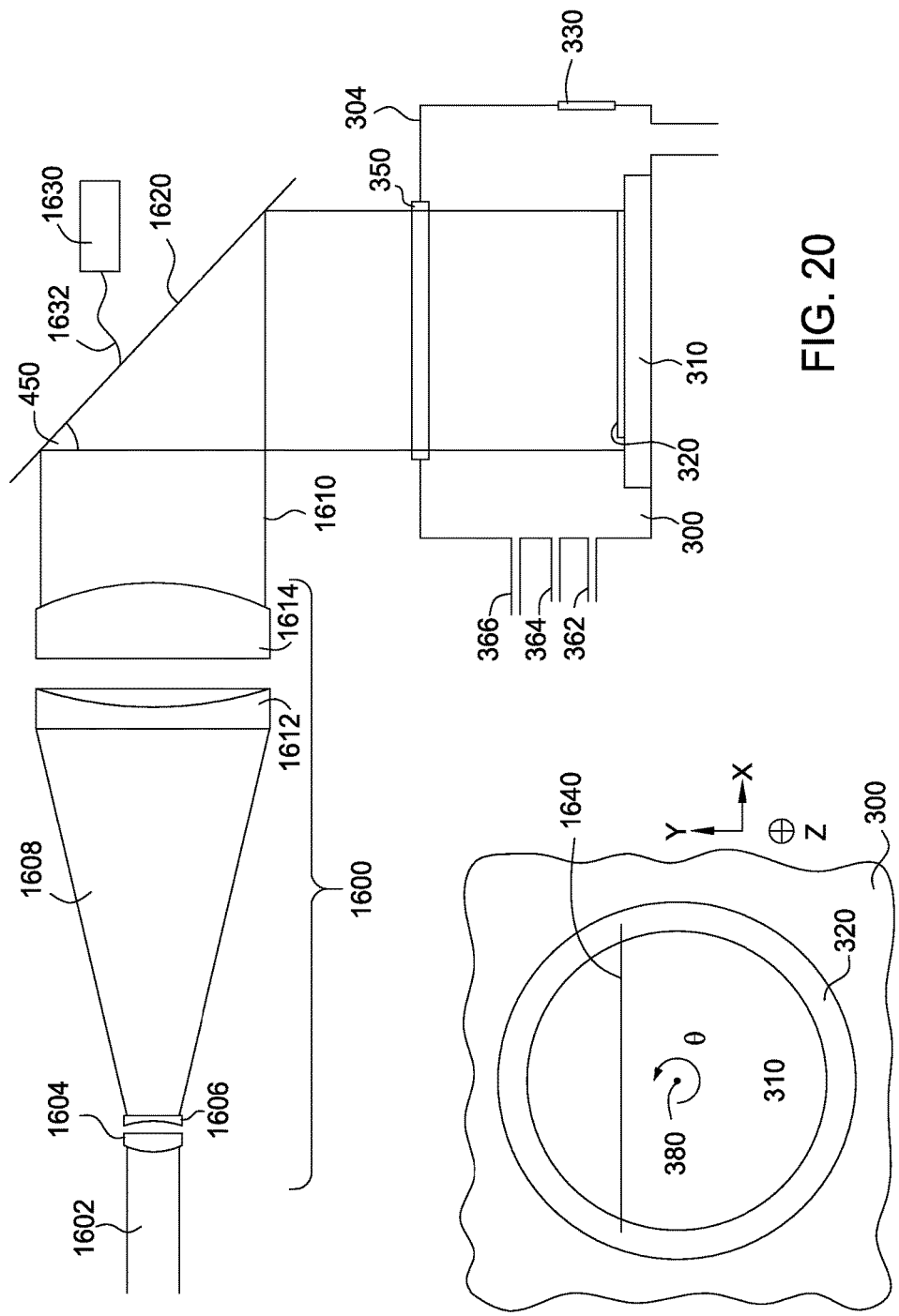

PHOTONIC ACTIVATION OF REACTANTS FOR SUB-MICRON FEATURE FORMATION USING DEPLETED BEAMS

CROSS-REFERENCE TO RELATED APPLICATIONS

This application claims benefit of U.S. Provisional Patent Application Ser. No. 61/863,740, filed Aug. 8, 2013, and of U.S. Provisional Patent Application Ser. No. 61/884,744, filed Sep. 30, 2013, each of which is incorporated herein by reference.

FIELD

The present disclosure relates to the forming of sub-micron sized material features, for example sub-micron sized trenches or lines, submicron sized pillars or apertures, and the like, wherein the submicron sized features are directly formed in situ with a deposition material, or are formed in-situ in a previously formed thin film, without the need for traditional photolithographic processing wherein a photoresist is exposed and developed, and the resulting pattern is transferred into an underlying material layer. In particular, an energy beam is provided which has sufficient energy to activate an etch or a deposition reactant(s) in a nanometer dimensioned region, and deposition or etching reactant(s) which are introduced into the nanometer dimensioned region are activated to from a deposition material or an etchant species in the region. The beam may be rastered across a workpiece, such as by moving the workpiece with respect to the beam, to effectuate the writing of a line or the etching of a trench, and as a result deposited and etched features of a nanometer sized dimension may be formed.

BACKGROUND

The relentless pursuit of smaller and smaller features in integrated circuits is approaching the limits of traditional photolithographic techniques. In these techniques, a photoresist is coated on a substrate, and a mask pattern is projected by electromagnetic radiation passing through the mask and onto the resist causing the resist to become exposed in a pattern corresponding to the features of the mask. The resist is then "developed" and rinsed in a solvent to remove a portion thereof and leave the photoresist, having the resulting projected mask pattern, on the surface of the substrate or on a film layer, such as a hard mask layer, located on the substrate. The material underlying the photoresist is etched, typically in anisotropic plasma based underlying film selective etching chemistry, to transfer the photoresist pattern into the underlying layer. Thereafter, the photoresist is removed by ashing or other removal techniques, and the substrate is wet cleaned to prepare it for the next process. However, feature sizes have shrunk below that which can be imaged (resolved) using these traditional lithographic techniques, and to extend the use of traditional lithographic techniques to form these features, subtractive techniques, such as double and triple patterning, have been employed. In these processes, to achieve the smaller feature sizes on the order of 40 or fewer nanometers, the hardmask may be patterned and used to etch an underlying patterning layer, and the hardmask removed and replaced with an additional hardmask, and the process of coating with resist, exposing through a mask, etching the hardmask, and then etching the patterning layer may repeated one or more times, to pattern the patterning layer before patterning the ultimate material layer in which the sub-40 nm features are formed. Nonetheless, despite these advances, current lithographic techniques will be insufficient to meet the reduced dimensions called for in future semiconductor technologies.

Modern photolithography depends upon the concept of a sacrificial "photo" exposed resist, wherein exposed areas of the resist that are exposed to light behave differently than those which do not. Because these techniques rely on electromagnetic radiation, diffraction limits the smallest feature size that can be imaged or resolved. Additionally, even if the feature size may be imaged, the energy entering the photoresist may also be scattered therein, leading to irregular exposure of the resist across the depth of the resist. As a result, the feature size which is exposed will actually be larger than the smallest resolvable image, and, it will have non-uniform sidewalls or other irregularities.

Currently, high-volume manufacturers are using deep-ultraviolet (DUV) photons, such as photons with a wavelength of 193 nm, to expose a photoresist material. Manufacturers are also using liquid immersion techniques and techniques such as the aforedescribed multiple patterning, to create patterned features on substrates of a small size.

Recently, laser beam lithography has again been investigated as a mechanism to expose very small features in photoresist and thereby break through the resolution limitations of traditional mask based photolithographic techniques by creating small cross section, high power laser beams. Fischer and Wegoner, in Laser and Photonics Reviews, 7, No. 1, 22-44 (2013) discuss an idea of using a stimulated emission depleted (STED) beam to expose the resist three dimensionally, i.e., in a columnar fashion, and thus direct laser write a feature through the full depth of the resist. In order to reduce the effective cross section of the resist which is exposed to sufficient energy to be polymerized thereby, two laser beams, a "normal" beam and a depletion beam, are used to form a STED beam. The excitation beam excites the polymer in the photoresist to cause it to polymerize, and the depletion beam reduces the energy in the photoresist before the photoresist polymerizes, thus keeping the photoresist from polymerizing where the depletion beam and the excitation beam energies overlap. Improved resolution occurs where the spatial maximum of the excitation profile of the normal beam corresponds with the local zero of the depletion profile of the depletion beams, i.e., the depletion beam is configured to spatially surround the excitation beam, and cull, from the resulting exposed regions of the photoresist, the polymerizing effect of the skirt region of the Gaussian beam. As a result, the portion of the excitation beam in which the polymerizing reaction is not cancelled by the depletion beam has a very sharp, nearly rectangular energy profile across its width rapidly reducing at the edges of the profile to an energy level below the polymerization energy of the resist, such that a sharply defined higher energy region is formed in the beam as opposed to traditional, Gaussian profile, beams. However, even using this direct laser beam exposure system, repeatable and sharply defined features smaller than 20 to 30 nm are difficult to achieve, in part because of the limit in the size of the sharply defined region of the beam, and in part because of inherent migration of polymerization in the photoresist being exposed from the location where the beam enters the photoresist into adjacent locations.

SUMMARY

In the embodiments herein, two different photon sources, such as lasers, soft x-rays, and the like, wherein each may have similar or different photonic energy levels, are directed to, but only partially overlap, a feature location on a substrate to be processed. The extent to which the beams overlap defines the size of the feature location at which photons of the two different beams are received on the substrate. Simultaneously, a precursor material is presented at the feature location, such that the photons of both beams may be absorbed by the molecules or atoms of the precursor, thereby increasing the reactivity of the precursor(s) and causing a reaction to occur only in the limited area of overlap of the two beams. Adjacent to the overlap region of the two beams, the energy of a single beam is insufficient to initiate the activation of the precursor.

In one aspect, to enable a more precise definition of an area where the overlapping beam energy is sufficient to cause a reaction to occur, two laser beams, at least one of which is formed by an excitation beam and a depletion beam, are directed to a reaction location on a surface such that the centers of the beams are offset at the reaction location, but the profile of the beams overlap, such that in the desired area in which the beams overlap, a region is formed where the photon energy of the two beams is sufficient to cause the reactants to have the desired reaction, but in the areas immediately surrounding the reaction location, the combined photon energies of the two beams are insufficient to cause the reactants to react, and thus a localized reaction zone may be formed. Where both beams are laser beams having an excitation source and a depletion source, a beam diameter of each beam over which the ultimately combined energy of the two beams is sufficient to cause reaction of the reactants may be well below 100 nm, as low as on the order of 20 nm. As a result, where the beams have a circular cross section, a bi-convex ovoid pattern having a width on the order of less than 20 nm, specifically of a single digit to tenth of a nanometer size, may be reliably formed to control the size of the reaction space in which an additive or subtractive reactive process may occur.

In one aspect, the precursor is a precursor(s) which, with the introduction of sufficient energy, will react to form a material useful in the production of film layers on the substrate, or for the reduction of such film layers through a reaction which removes the film layer material, i.e., etching. However, outside of the region of overlap of the two beams, photons in the high energy central region of only one beam are received by the precursor, and thus sufficient energy is not introduced to cause the reaction to occur.

As an example, the activation of silane, trichlorosilane, tri-silane, etc., is known to react to deposit silicon. However, the two gases require an introduction of energy, provided for example by lamps or plasma, to drive the reaction to occur. In these systems, the reaction occurs wherever the lamp or plasma energy is sufficient to drive the reaction to occur, which occurs over a large area of a substrate, often the entire surface thereof. By using overlapping beams having two different photon energies, as described herein, only where the beams overlap will sufficient energy be present for the reaction occur, and thus silicon will be deposited only in the overlap region.

In a further embodiment, the two different lasers are configured as STED lasers, such that the region in the perimeter of the beam profile is energy depleted, further reducing the diameter of the beam above a desired threshold photon energy, whereby the size of the overlap of the two beams, in an energy range where two photon based reactions can occur, is even further reduced.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
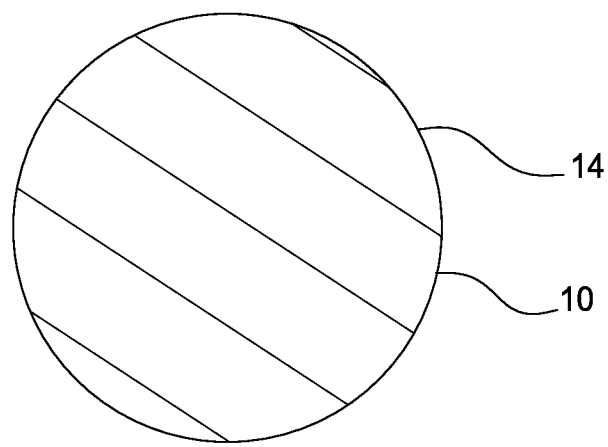
FIGS. 1A and 1B show features of an electromagnetic beam.
Figure 2A:
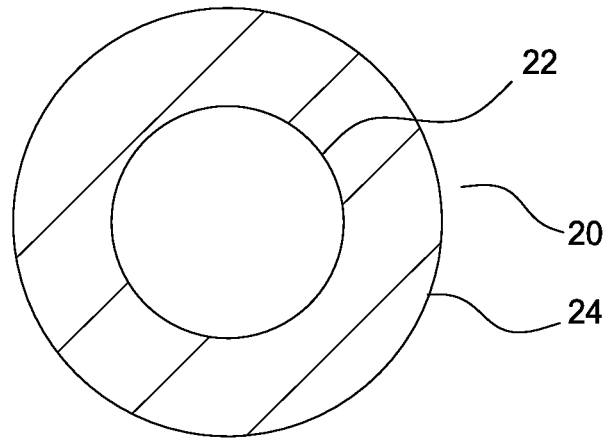
FIGS. 2A and 2B are representative drawings of a depletion beam useful for combining with the beam of FIGS. 1A and 1B.
Figure 3A:
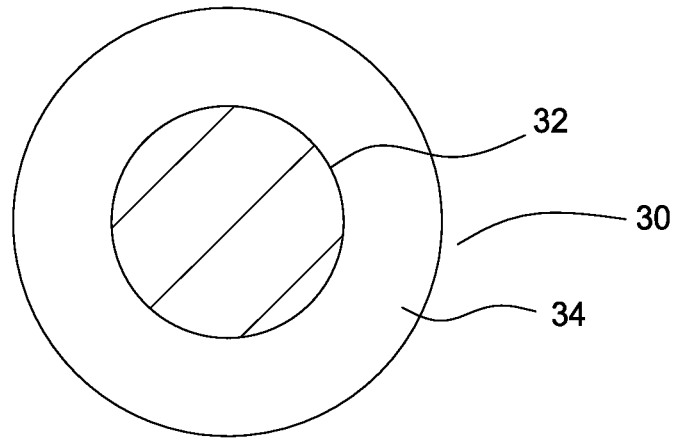
Figure 1B:
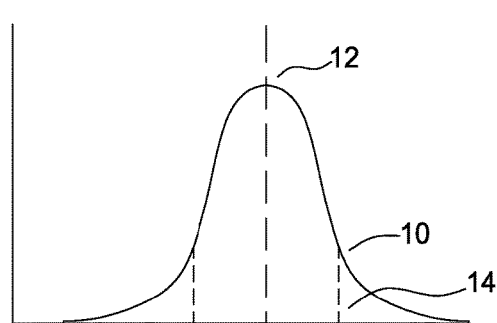
Figure 2B:
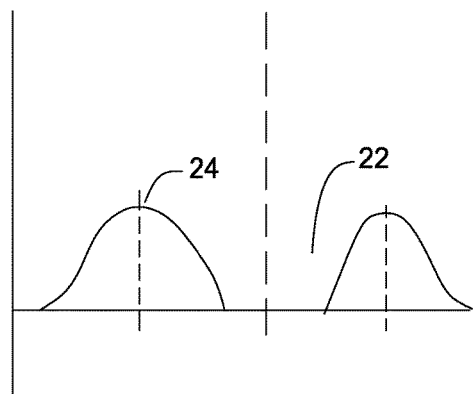
Figure 3B:
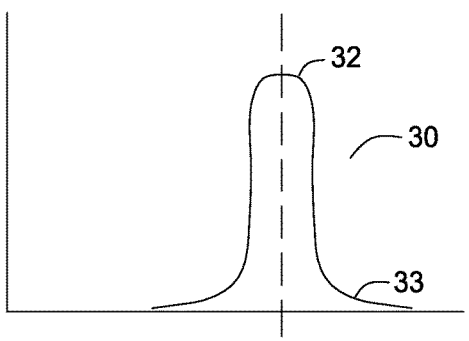

FIGS. 3A and 3B graphically show the effect of combining the beam of FIGS. 1A and 1B with the depletion beam of FIGS. 2A and 2B.

Figure 4B:
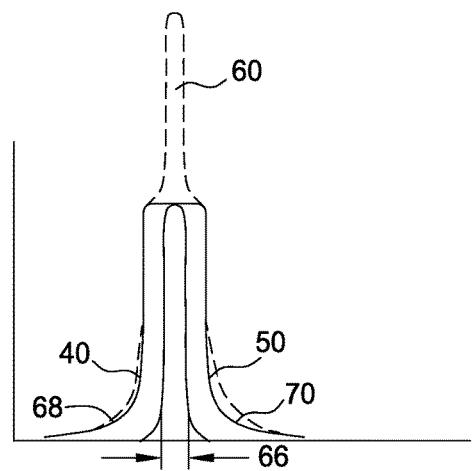
Figure 4A:
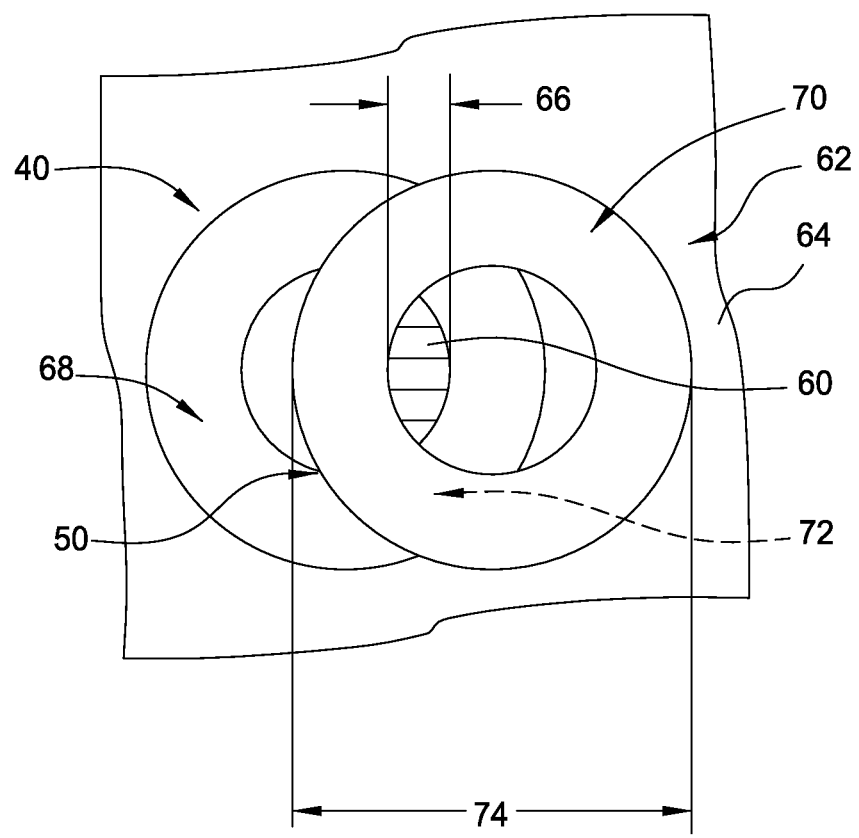

FIGS. 4A and 4B show the overlap of two of the beams of FIGS. 3A and 3B.

Figure 5:
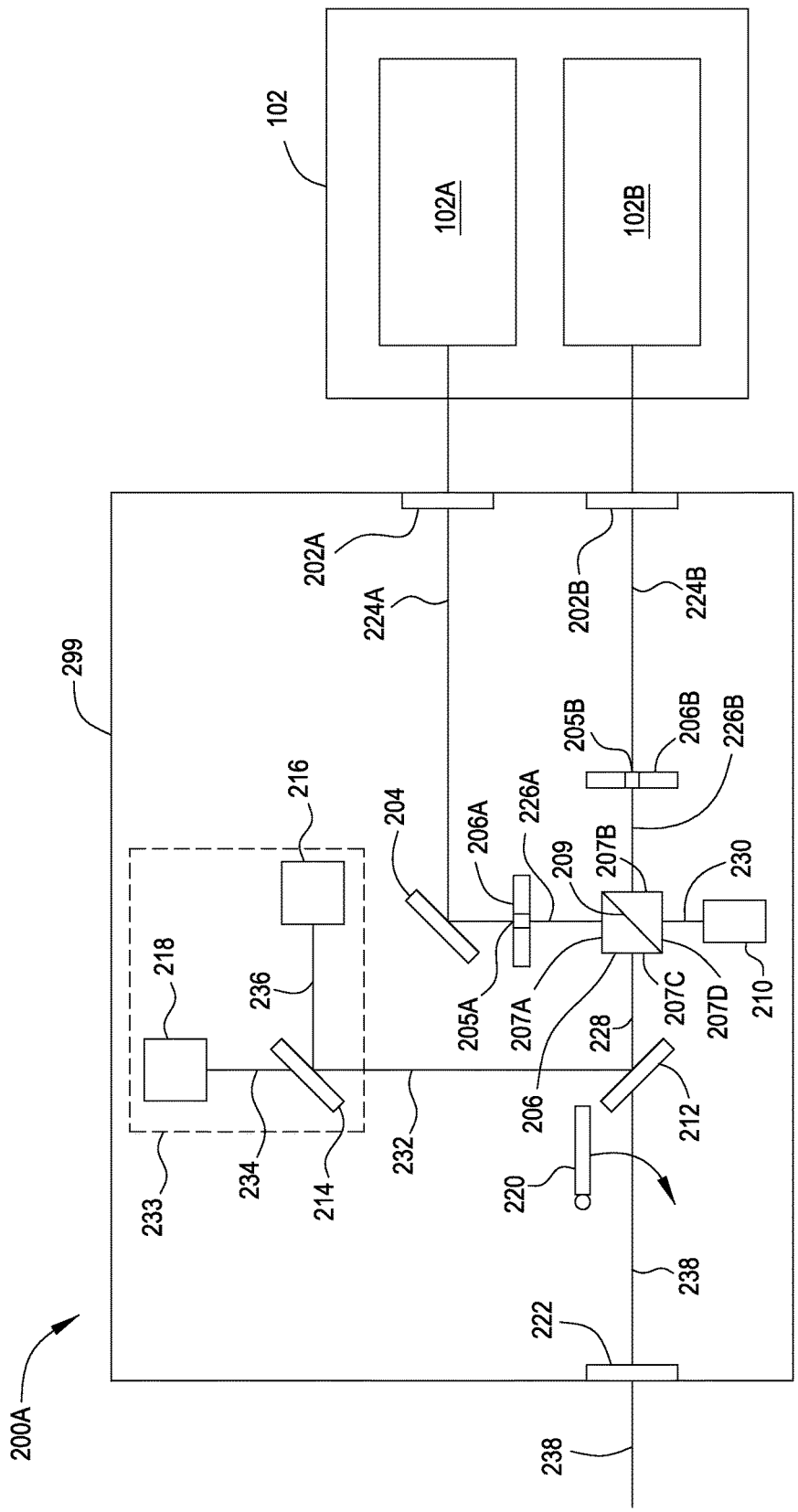

FIG. 5 shows a configuration of a beam combiner for combining a beams of FIGS. 1A and 1B with a depletion beam of FIGS. 2A and 2B.

Figure 6:
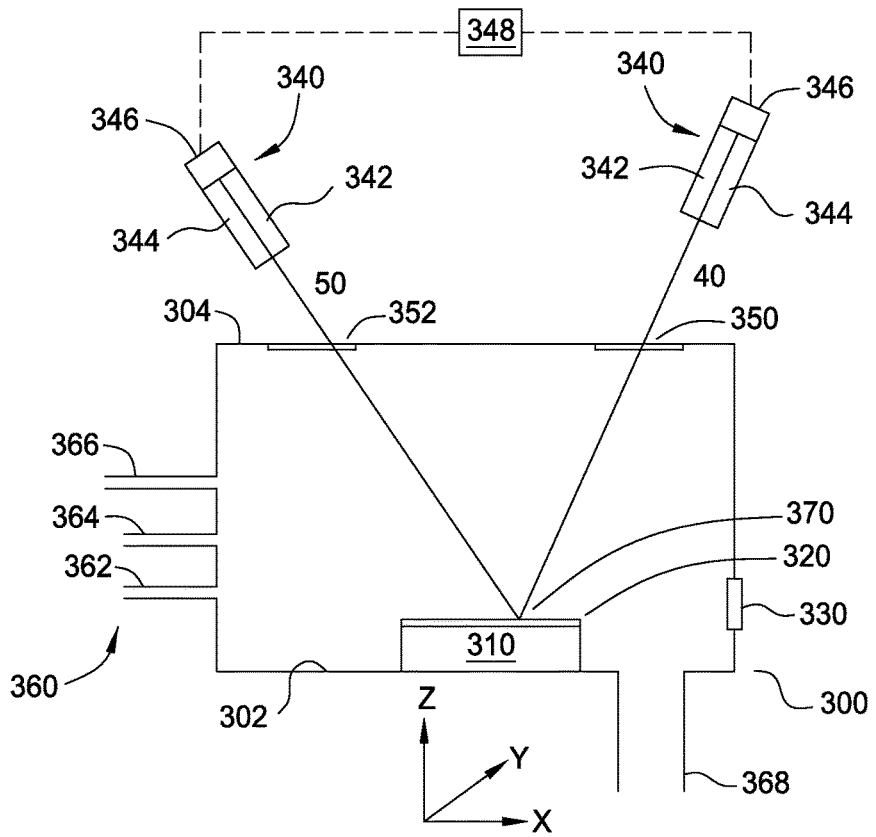

FIG. 6 is schematic representation of a chamber useful for photonic deposition using partially overlapped depleted beams in conjunction with a deposition precursor(s).

Figure 7:
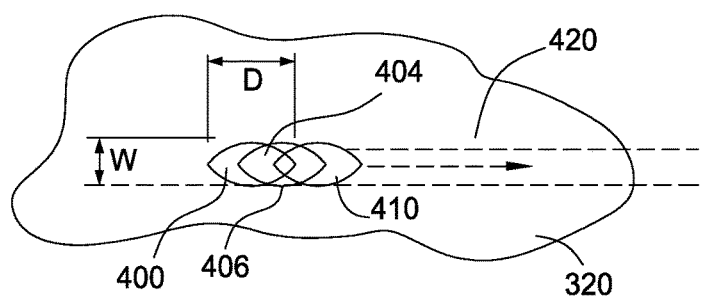

FIG. 7 demonstrates the effect of sequential photonic deposition in adjacent areas of a substrate.

Figure 8:
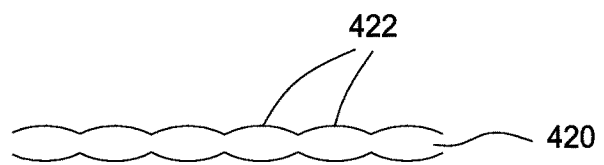

FIG. 8 demonstrates the use of sequential photonic deposition to form a line on a substrate.

Figure 9:
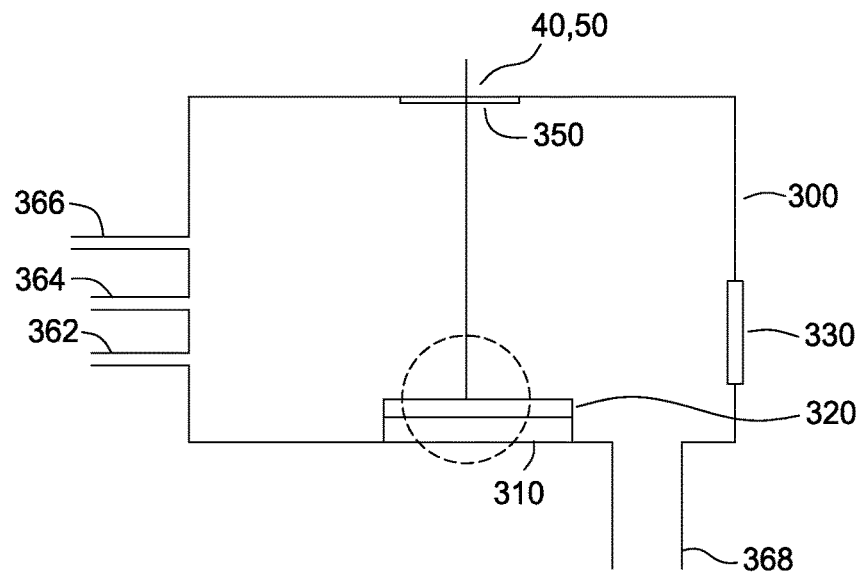

FIG. 9 is a schematic representation of a chamber useful for photonic deposition or etching using partially overlapped depleted beams in conjunction with a deposition or an etch precursor(s).

Figure 10:
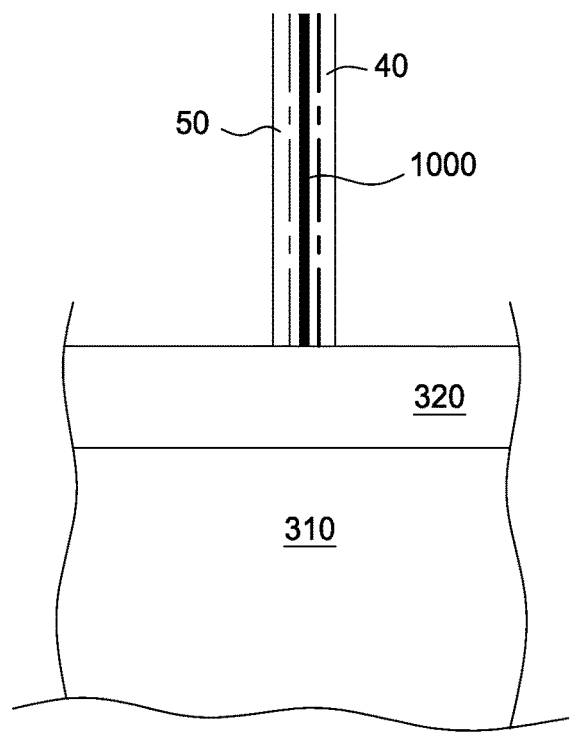

FIG. 10 is a representative view of two overlapping parallel depleted beams.

Figure 11:
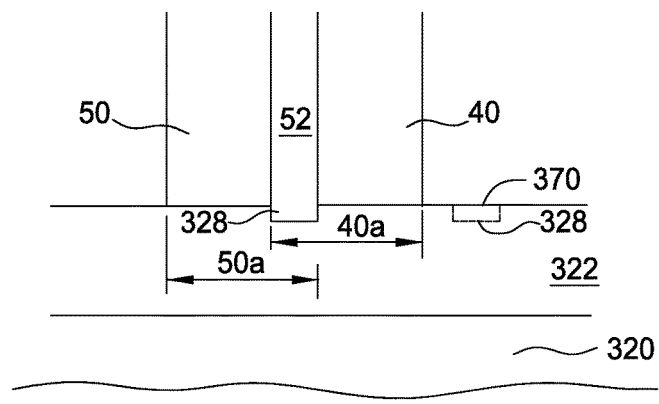

FIG. 11 is a schematic view of a partially etched feature in a film layer using the overlapping beams of FIG. 10 in conjunction with an etching precursor.

Figure 12:
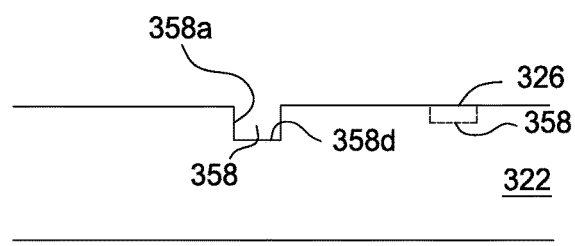

FIG. 12 is a schematic view of two partially etched features in a film layer using the overlapping beams of FIG. 10 in conjunction with an etching precursor.

Figure 13:
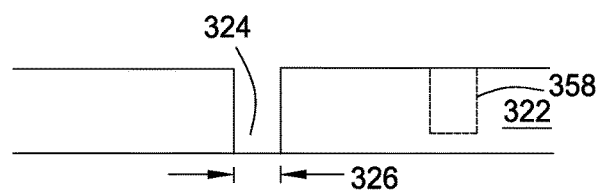

FIG. 13 is a schematic view of a fully etched and a partially etched feature in a film layer using the overlapping beams of FIG. 10 in conjunction with an etching precursor.

Figure 14:
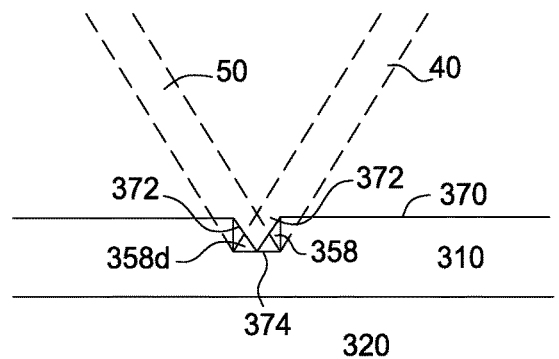

FIG. 14 is a schematic representation of the geometric limitations imposed on etching and deposition processes where the two depleted beams converge at the substrate.

FIGS. 15A to 15D are schematic representations of various apparatus for concurrently providing a plurality of overlapping beamlets to a substrate.

Figure 15A:
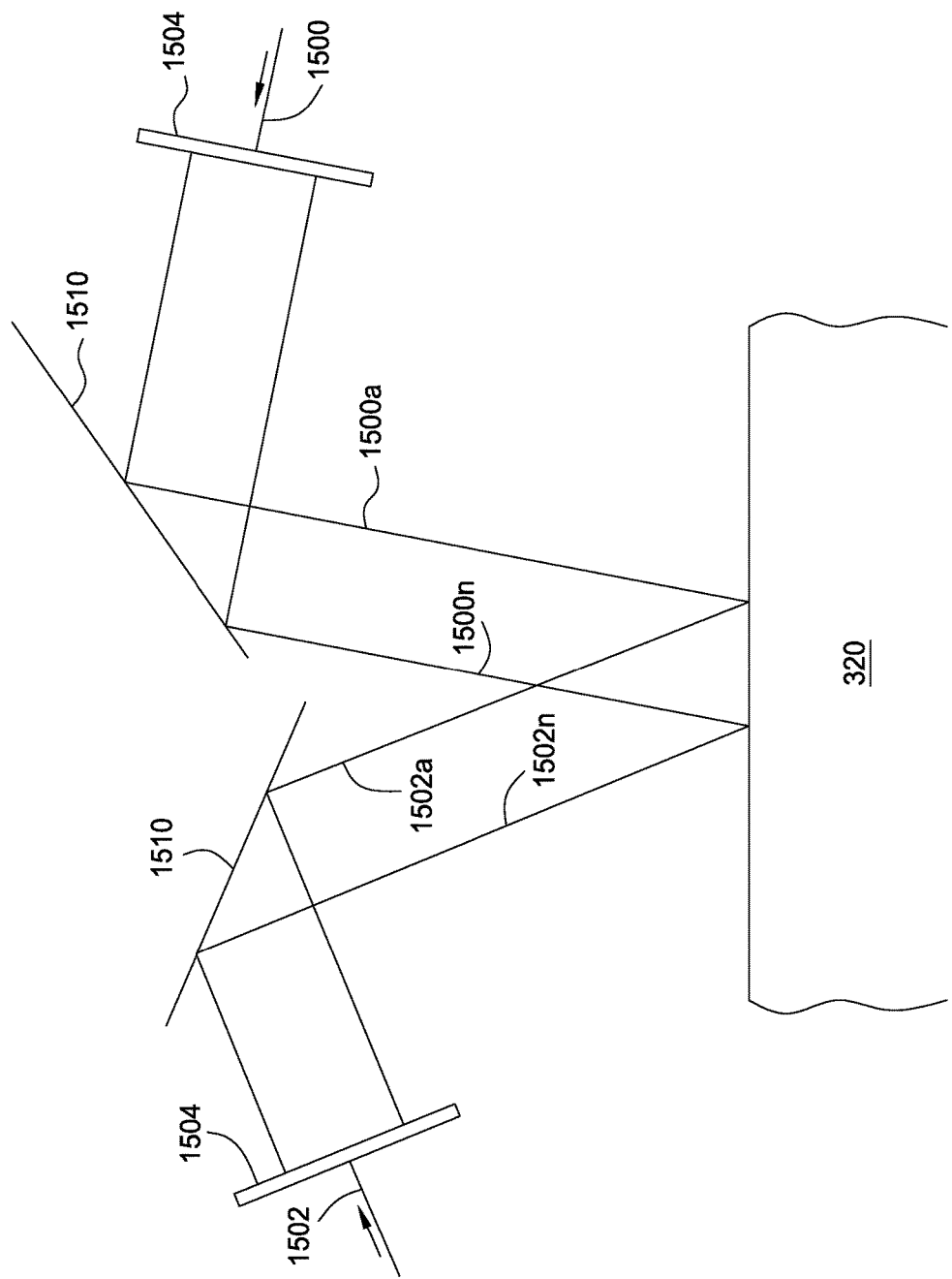
Figure 15B:
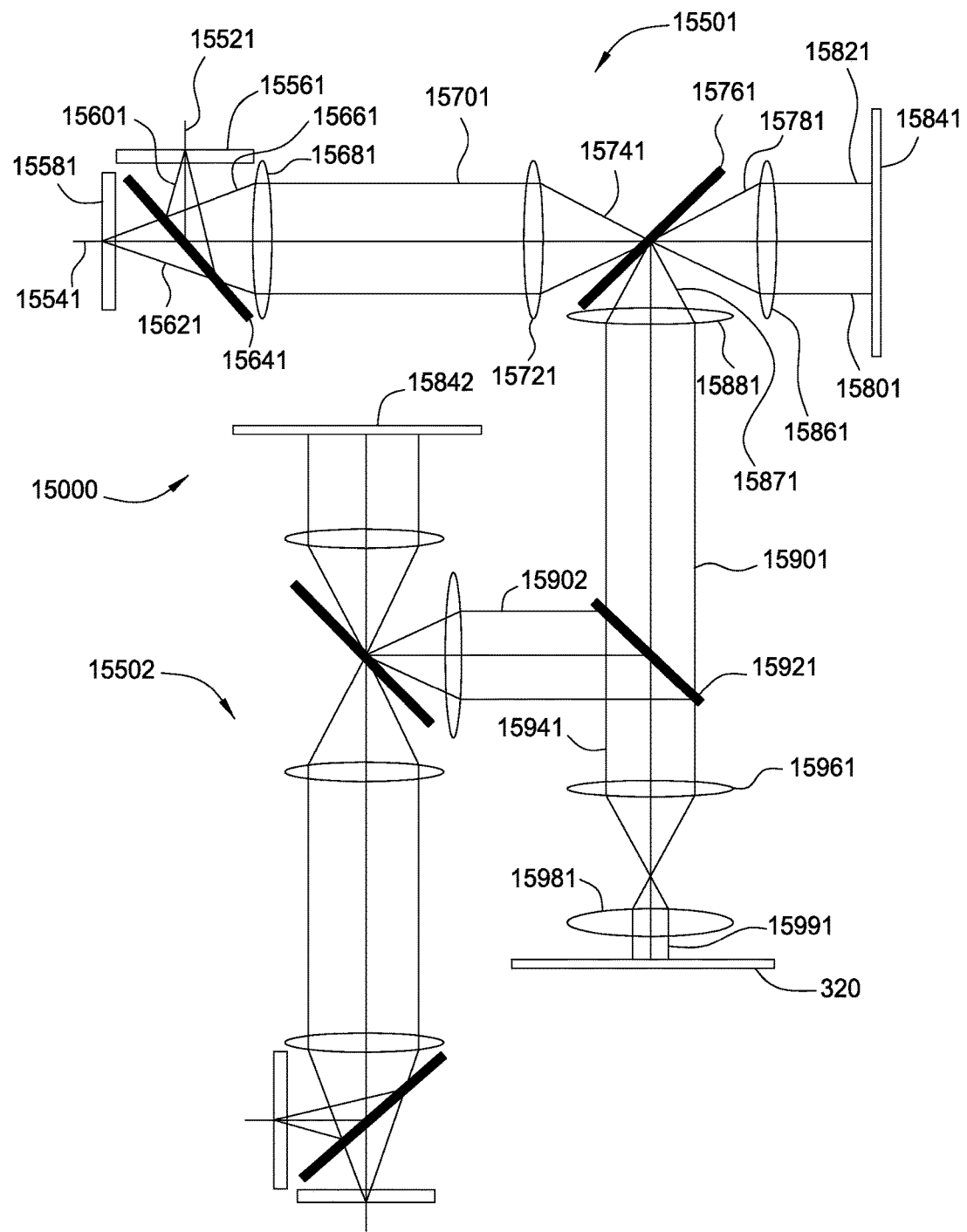
Figure 15C:
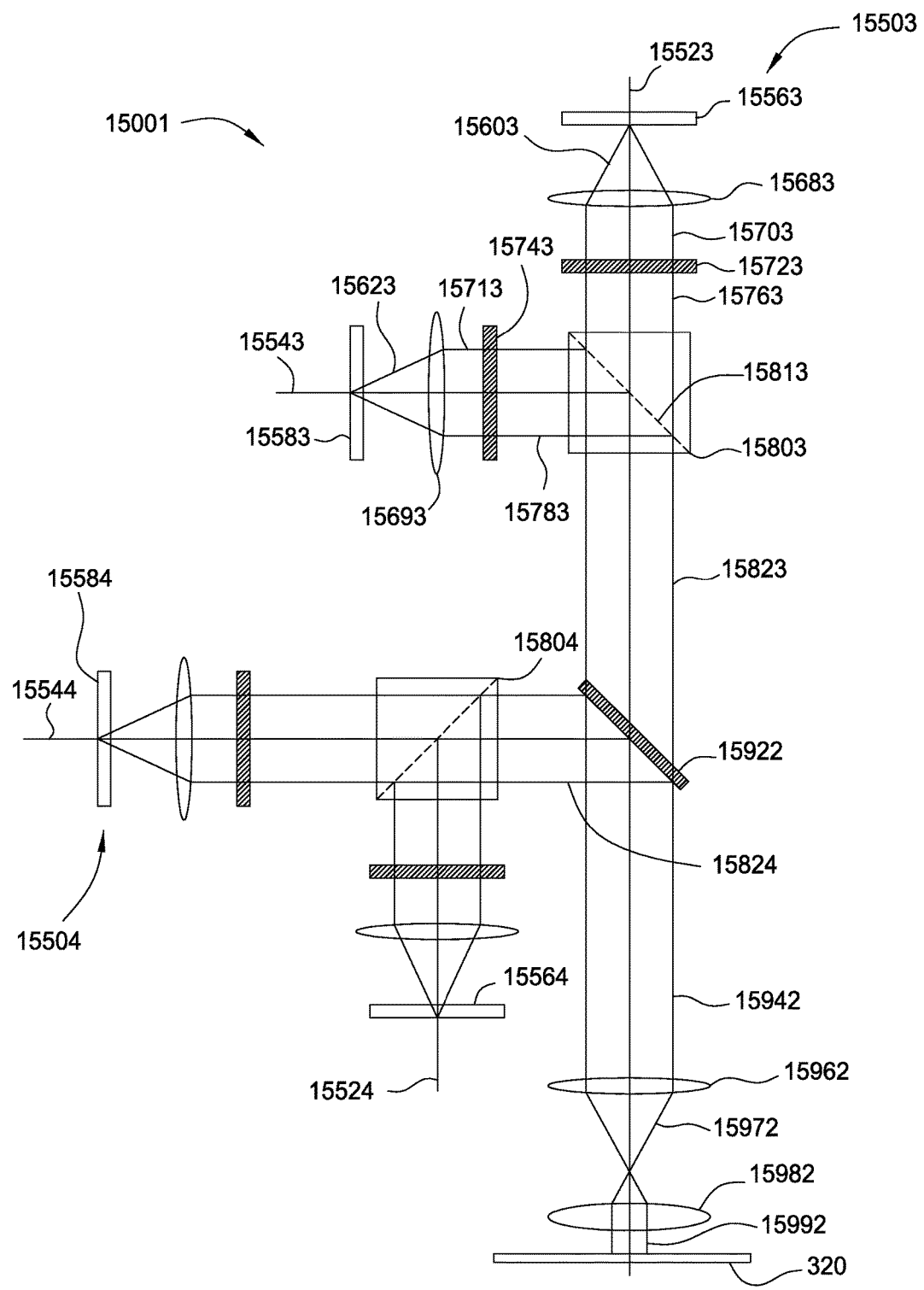
Figure 15D:
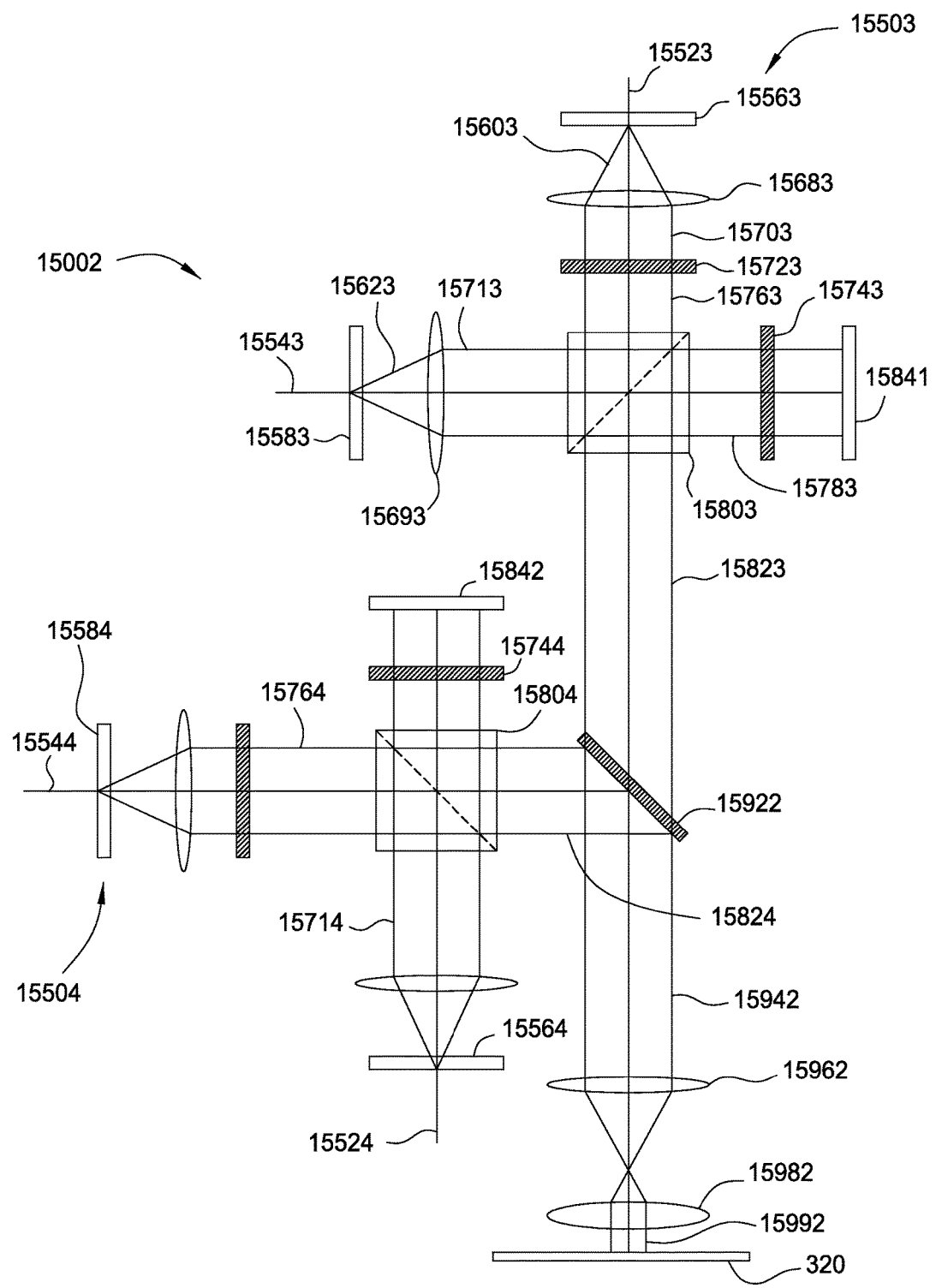
Figure 15E:
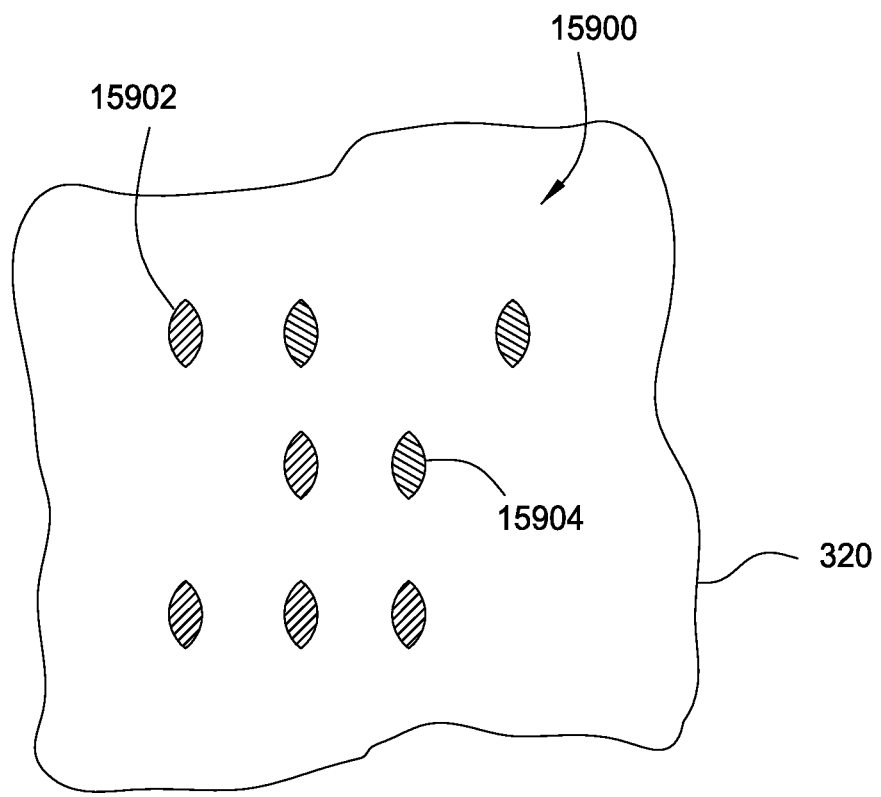

FIG. 15E is a schematic representation of a substrate undergoing processing using one of the apparatus of FIGS. 15A-D.

FIG. 16 is a partial frontal view of a micro-mirror array useful for controlling the direction of a beamlet to a position on, or off of, a substrate or an overlap location on a substrate.

FIG. 17 is an enlarged partial sectional view of the micromirror array of FIGS. 15A to 16.

FIGS. 18A to 18F demonstrate the results of one method of writing multiple features of different dimensions on a substrate.

Figure 19:
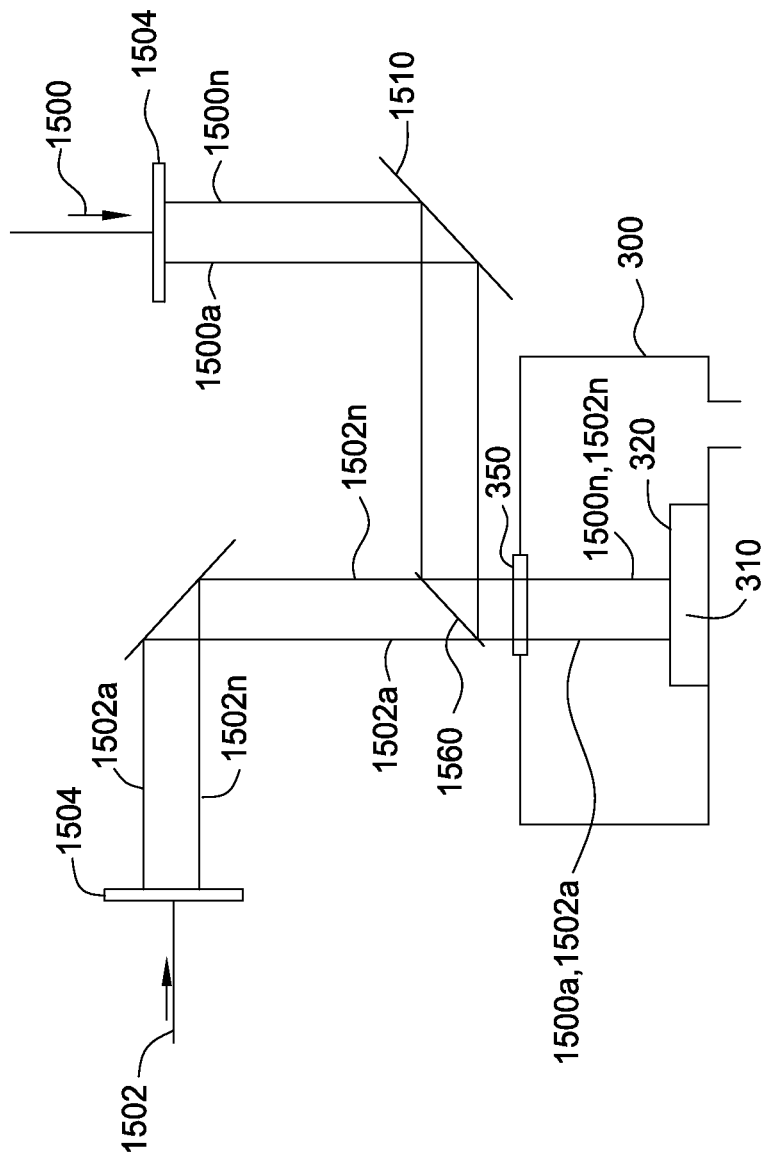

FIG. 19 is a schematic representation of a beam splitting and controlling apparatus for simultaneously providing a plurality of parallelly disposed and overlapping beamlets to a substrate.

FIG. 20 is a schematic representation of a photonic treatment system for a workpiece employing a sheet beam source.

Figure 21:
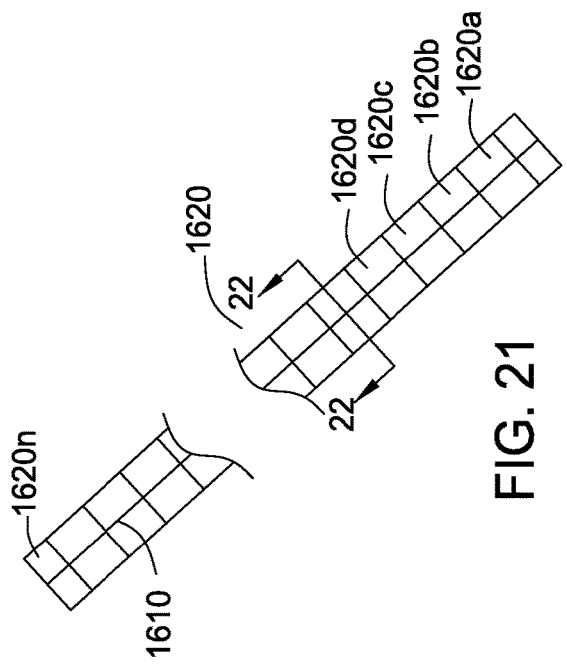

FIG. 21 is an enlarged view of a micromirror array of the photonic treatment system of FIG. 20.

Figure 22:
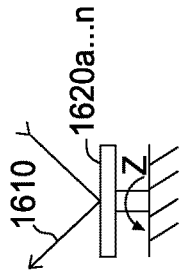

FIG. 22 is a sectional view of the micromirror array of FIG. 21.

FIG. 23 is a plan view of a workpiece in a chamber undergoing photonic treatment.

Figure 24:
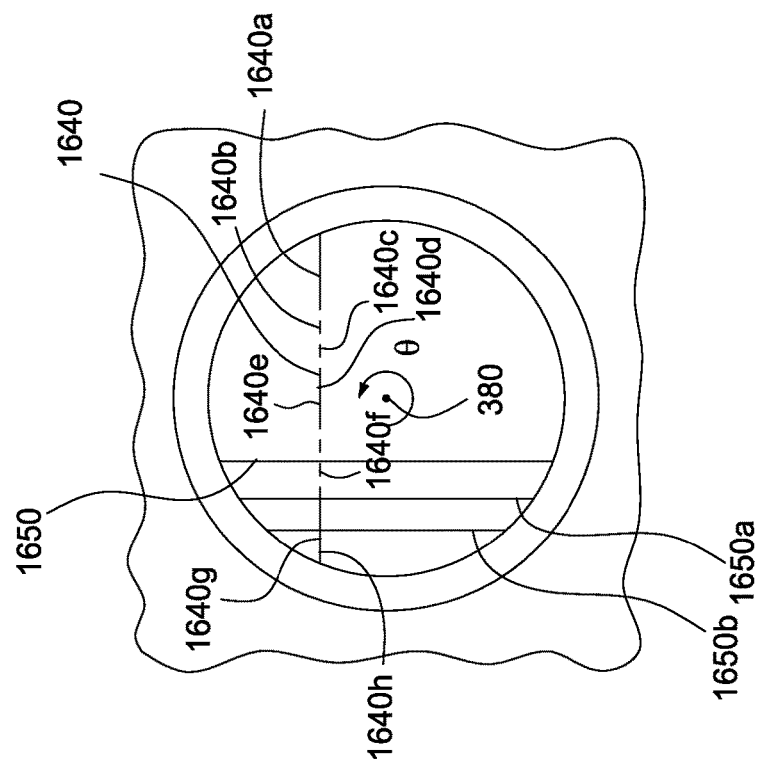

FIG. 24 is a plan view of the wafer and chamber of FIG. 23, wherein the workpiece is undergoing further photonic treatment.

Figure 25:
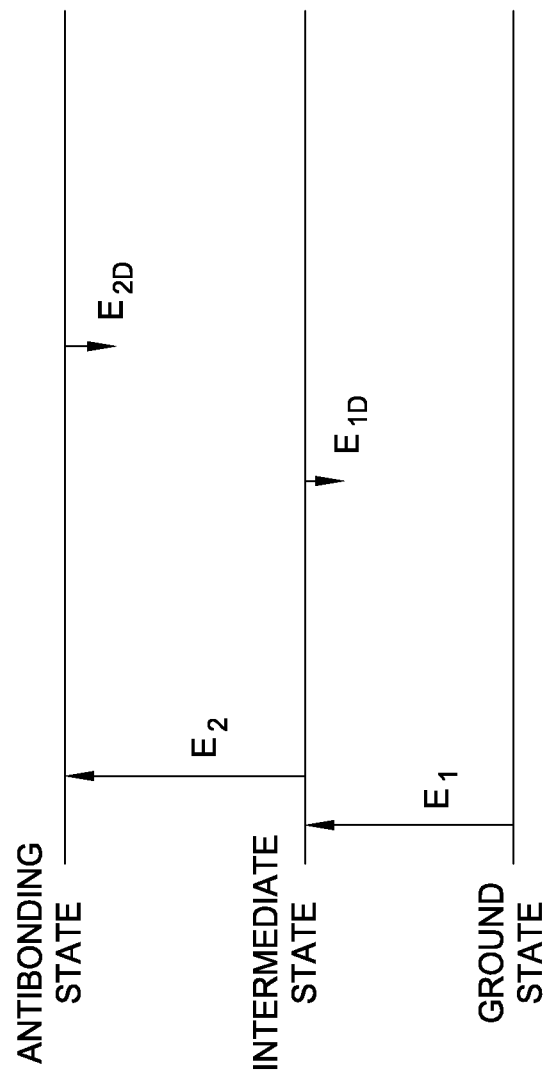

FIG. 25 is an electron energy diagram of a precursor.

DESCRIPTION OF THE EMBODIMENTS

Described herein are several configurations of a photon deposition or etch system, whereby a combination of photons supplied by two or more beams having different wavelengths are received in a small target area in the presence of a reactant, wherein neither photon energy is sufficient to cause a desired reaction to occur, but the temporal and physical presence of the two photons or groups of photons, together with the reactants, causes a desired reaction to occur.

Figure 1C:
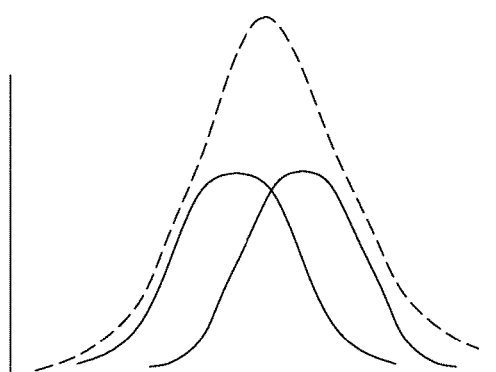
FIG. 1C shows the result of overlapping two of the beams of FIGS. 1A and 1B.

Referring first to FIGS. 1A to 1C, a standard beam profile 10 of a laser beam, and the effect of overlapping two such beams, is shown. In the profile 10 shown in FIGS. 1A and 1B, the beam has a peak energy 12 which tapers off to either side thereof following a Gaussian profile. The half width full maximum energy level 14 of the beam is the profile shown in FIG. 1A. In FIG. 1C, the effect of combining by overlapping two Gaussian beams with the same energy profile is shown in dashed line profile.

Now referring to FIGS. 2A and 2B, a depletion beam 20, which is used in combination with the standard beam 10 as the excitation beam 10 to form a STED beam 30 of FIG. 3A, is shown. As shown in FIG. 2A, the depletion beam 20 is red shifted in comparison to excitation beam 10, and it has a depleted central region 22 with an intensity peak 24 surrounding the depleted central region 22, i.e., it has a doughnut shaped intensity profile created by passing the depletion beam through a vertex phase mask. The red shifted beam energy causes a reduction in excitation energy of previously excited species where the depletion beam 20 and the excitation beam 10 overlap. When the beams of FIG. 1 and FIG. 2 are collinearly combined, as is shown in FIG. 3, a depleted excitation beam 30, having a substantially smaller high intensity central region 32 than the width of the beam of FIG. 1A, and a significant taper in beam energy in the skirt region 34 of the beam immediately adjacent thereto, is formed. Basically, the beam energy profile, across its width, approaches a rectangular shape. Additionally, the greater the power of the depletion beam 20, the sharper or more rectangular the resulting depleted excitation beam 30 profile, i.e., where a laser has a resolution of 300 nm without the overlay of the second beam 30, a resolution of 20 nm (i.e., a spot diameter at the focal location) can be achieved by imposing a depletion beam power on the order of 500 Mw/cm$^2$. For a 10 to 100 nsec pulse, a depletion beam on the order of 1E7 W/cm$^2$ is used.

In operation, the depletion beam 20 peak intensity overlies the perimeter of the excitation beam, and in that region, the red shifted energy of the depletion beam de-excites the reactants present in that region which were excited by the lower energy in the skirt of the Gaussian beam, resulting in a beam having sufficient energy to cause the atoms and molecules of the reactant(s) to remain excited only in the central region of the beam within the circumference of the doughnut region.

Referring now to FIGS. 4A and 4B, the use of two such STED depleted beams 40, 50 to form an overlap region 60 incorporating a portion of the first STED beam 40 and the second STED beam 50 is shown. In FIG. 4B, the effect of overlapping the depleted beams 40, 50 is shown, and compared to the overlapping of two Gaussian profile beams as shown in FIG. 1C is clearly contrasted. In particular, the skirt regions are regions where the reactants excited by the energy in the skirt region of the excitation beam are de-excited by the red shifted depletion beam, such that the overall energy peak occurs in region 60, and thus there is a distinct region of overlap where the drop off from a high energy to nearly no beam excitation of species is defined. In FIG. 4B, the high energy excitation capability present in the overlap region 60 is highly defined (as shown in dotted line profile) compared to the skirt regions 68, 70 of the two beams. As shown in FIG. 4A, the beams 40, 50 are focused on a limited area 62 of a substrate 64 (only partially shown), and each has a beam energy profile of the STED beam 30 of FIG. 3. In the embodiment of FIG. 4A, the depleted skirt region 68 of beam 40, and the depleted skirt region 70 of beam 50 intersect in area 72 of the substrate 64, such that an ovoid overlapping region 60 of the non-depleted high energy central regions 32 (FIG. 3) of the two beams 40, 50 is formed. The beam energy is configured such that, within the ovoid overlapping region, a photon from one beam, for example beam 40 is not sufficient to cause a reactant located immediately over the substrate 64 and within the ovoid overlapping region 60 to reach a reaction state, such that when the second beam 50 supplies a photon which when absorbed by the molecule in the excited state as a result of interaction with the first photon, is sufficient to drive a deposition or etch reaction of the reactant. The reactant(s) is selected such that the combined energies of the high energy regions 32 of the two beams are sufficient, when spatially and temporally aligned, to cause a desired deposition or etch reaction to occur, but where the two beams 40, 50 overlap but the two high energy regions 32 thereof are not overlapping, for example at location 74 where the high energy region of beam 50 overlaps the skirt region 68 of beam 40, the combined energies are insufficient to cause the reactants to react deposit or etch a material. Thus, because these two beam (photon) energies are spatially present only in the ovoid overlapping region 60, the reaction occurs only in the ovoid overlapping region and thus a very small feature may be deposited or etched.

As is also shown in FIG. 4A, although the full overlap of the full profile of the two STED beams 40 and 50 may be significant, the actual overlap where sufficient energy for reaction will be present is very small, as shown by dimension 66. For example, where the beam 50 full width (3 standard deviations) across the edge of the skirt 70 is on the order of 40 nm, the width 66 of the ovoid region may be on the order of less than 10 nm, even less than 5 nm. As a result, a very small spot size may be created where direct photonic writing of a film layer one molecule thick (resulting from a reaction of a molecule or atom as a result of receipt of two photons of different energies by the two beams 40, 50), or etching by individual etchant reaction molecules in the ovoid region, is possible. The thickness of the film deposited, or the etch depth of the underlying film, is a function of the absorption cross-section of each precursor at the wavelength of the photons, the quantity of photons arriving at the overlap locations over the duration of time that the two beams are on and overlapping, and the availability of deposition or etch reactants at the overlap site during that same period. Thus, using an extremely short pulse of a very low concentration of reactive precursor can result in very thin features on the order of one atom thick. Longer overlap times and higher precursor concentration will yield thicker features. Where the overlapping STED beams are used to activate the reacting (final) precursor in atomic layer deposition or etch processes, single atom thick features may be created. Hence, the system of two depleted beams, for example two STED depleted beams, can be used to replace traditional photolithographic film forming, mask exposure, develop and strip steps to form features by additive or subtractive atomic and molecular scale photonic reaction on a single digit nanometer scale, thereby significantly reducing the number of steps, and substrate handling, to form such features.

To ensure temporal overlap of the photons of the first and second beam, both beams 40, 50 may be maintained in a constant on state during a period of deposition. Additionally, and more preferably, the first beam 20 may be maintained in a constant on state, to continuously excite molecules and atoms of the reactant(s) to an excited but not yet reactive state within the span of the high energy region 32 thereof, and the second beam 50 may be pulsed, such that in the ovoid overlapping region 60 second photons, provided by beam 50, and at the same or different energy than a photon provided by beam 40, are absorbed by the reactant resulting in the deposition or etch reaction within the ovoid region 60.

Additionally, it is contemplated that both the first and the second beams 40, 50 may be pulsed. Because the excited state provided by the first beam photons is temporary, the timing of the pulses of the second beam 50 compared to the pulses of the first beam 40 will dictate whether a reaction occurs.

Referring now to FIG. 5, an arrangement for the formation of the depleted beam is shown schematically. In this example, the combining of two laser beams, an excitation and a depletion beam, are schematically described. As shown in FIG. 5, a beam combining chamber is coupled to a first excitation beam source 102A and a second depletion beam source 102B, such that a combined, collinear output of the two beams 238 may result. Specifically, chamber 299 includes a first window 202A aligned with the projection of the beam 224A emanated from excitation beam source 102A, and a second window 202B aligned with the depletion beam 224B emanating from depletion beam source 102B. In this aspect, beam 224A enters the chamber through window 202A, and is reflected 90 degrees by mirror 204, then passes through a resolving aperture 205A in resolving plate 206A where it is again reflected 90 degrees, to a path parallel to the entry path into the chamber 299, by a half silver mirror (beamsplitter) 209 and coextensive with depletion beam 224B.

Depletion beam 224B enters chamber 299 through the second window 202B and then passes through resolving aperture 205B in resolving plate 206B before passing through half silvered mirror 209 where it becomes coextensive with, and axially aligned with, excitation beam 224A. The combined beams 238 then pass through a second half silvered mirror, where a portion 232 of the beam is sent to an energy analyzing station and the main beam passes a blanking shutter 220 and out through an outlet window 222 to form beam 50. By actuating the shutter 220, the beam 50 emanating from chamber 299 may be periodically blanked in the chamber 299, such that the second beam 50 may be only periodically positioned to overlap on the target location surface where a reaction is intended to occur.

Referring now to FIG. 6, a schematic of a process chamber for carrying out photon based reactions on a workpiece surface is shown to demonstrate the basic features of the deposition or etching process. In this figure, the workpiece is a substrate, such as a semiconductor substrate useful for the fabrication of integrated circuit devices.

As shown in FIG. 6, a chamber 300 includes a platform 310 therein onto which a substrate 320 may be placed for processing. Additionally, the chamber 300 includes an access port 330, such as a gate or slit valve, by which a substrate 320 may be loaded into, and removed from, the chamber 300, such as by a robot having an end effector which is configured to place the substrate 320 onto, and remove the substrate 320 from, the platform 310, as is well known in the art of semiconductor device manufacture. Additionally, in this embodiment, the platform 310 is configured to move in the X direction (parallel to the plane of the page of FIG. 6), the Y direction (into and out of the plane of the page of FIG. 6), and the Z direction (upwardly and downwardly with respect to the base 302 of the chamber 300). The platform 310 may also be configured to rotate about the center thereof.

The chamber 300 further includes a first chamber window 350, and a second chamber window 352, which in this embodiment are located on the cover portion 304 of the chamber 300. The windows are configured to be able to seal against the chamber cover portion 304, but are also transmissive to light energy provided by the beams 40, 50 previously described herein with respect to FIG. 4. Furthermore, there are provided a plurality of reactant inlet ports 360, in this case ports 362 and 364, a background gas port 366, and an exhaust port 368.

The beams 40 and 50 are generated by energy sources 340, each of which may have a first emitter 342 and a second emitter 344. The first emitter 342 may be a source of an excitation beam while the second emitter 344 may be a source of a depletion beam. The energy source 340 may include optics described elsewhere herein for combining the excitation and depletion beams to form the STED beams 40 and 50. Each of the energy sources 340 may include a firing control module 346 that controls release of energy pulses from the emitters 344 and 342. An electronic timing box 348 may be coupled to each firing control module 346 to synchronize pulsing or firing of the two STED beams 40 and 50. In this way, precise control of pulse and duty cycle timing may be exercised to perform the methods described herein.

In this embodiment, beam 40 enters chamber 300 through window 350, and beam 50 enters chamber 300 through window 352. In this embodiment, the beams 40, 50 are stationary, i.e., the path of the electromagnetic energy is fixed, such that the beams are configured to intersect, in the fashion of FIG. 4, at reaction region 370. Reaction region 370 has the ovoid cross section shown in FIG. 4, and, is fixed three dimensionally in the x. y and z directions within the chamber 300.

To perform a process to cause a reaction in the chamber in the reaction region 370, a substrate 320 is loaded onto the platform 310 through the valve 330, and the valve 330 is closed. The exhausting or pumping of the chamber 300 reduces the chamber pressure to a sub-ambient pressure, for example, in the millitorr range, and a background gas, such as the inert gas argon, is flowed into the chamber through background gas port 366 until a stable pressure is reached based on the incoming flow of argon and the exhaust flow through the exhaust port 368. Once a steady pressure is reached, reaction gas(es) are flowed through the reaction gas ports 362, 364, to provide one or more reactive gases over the surface of the substrate 320, particularly in the reaction region 370, separately or in a mixture. Alternatively, in some reactions, only one reactant need be supplied through only one of ports 364, 362. The beam 40 is supplied to the chamber 300 through the window 350, and the second beam 50 is supplied through the window 352 to intersect at reaction region 370. As a result, the combined photon energy of the beams 40, 50 in the ovoid reaction region 370 is sufficient to cause the reactant(s) to react and cause either a localized deposition or etch reaction in the ovoid reaction region 370.

To cause the reaction to occur at different locations on the substrate 320, the platform 310, on which the substrate 320 is held, may be moved in the x and y direction, thereby moving the relative position of the ovoid reaction region 370 on the substrate 320. Additionally, where the beams intersect at the deposition region as shown in FIG. 6, the substrate 320 may also be moved in the z direction to ensure that the size of the ovoid overlap region 370 does not change as material is deposited in the region and the distance from the top of the deposited material to the beam sources is reduced.

Referring to FIG. 7, there is shown the photonic writing of a line on the order of 5 to 10 microns in width W across the surface of a substrate 320 using the chamber 300 of FIG. 6. As is shown in FIG. 7, a first ovoid region 400 is formed on the substrate and a deposition reactant, for example silane, is provided through one of the reaction gas ports 362, 364 of FIG. 6, and it forms a thin silicon layer approximately one or more atoms thick across the span of the ovoid region to form a first ovoid deposition region 402. The substrate is then incrementally moved less than half the long dimension D of the ovoid, and the deposition process is repeated to form a second ovoid region 406, leaving a first region 402 of the first ovoid region with a deposited Si layer approximately one or more atoms thick and a second portion 404 of the first ovoid region 400 having a thickness of approximately twice the thickness of the first deposition formed where first and second ovoid regions 400, 406, overlap. The substrate 320 is again moved the same distance in the same direction, and a third ovoid region 410 is formed, partially overlapping the first and the second ovoid regions 402, 406, providing a three times thickness layer in a portion of the first ovoid region 402, and a two times thickness layer in a portion of the second ovoid region 406. By repeatedly moving the substrate in this manner, a line 420 may be directly photonically deposited on the substrate 320, having a thickness on the order of three or more atomic layers of Si. To increase the thickness of the line 420, the platform 310 on which the substrate 320 is held may be lowered, on the order of the thickness of the line 420, and the photonic deposition process is repeated over the length of the line 420 one or more times, or the duration of the beam overlap period is increased. As a result, a line 420 having the width of the ovoid reaction region 370 may be formed on the surface of the substrate to a desired thickness.

Referring to FIG. 8, the resulting line is shown. As can be seen in FIG. 8, the line sidewall includes a number of "scallops" or arced regions, extending or bulging the line outwardly in a direction perpendicular to its length. The relative size of these scallops in comparison to the width of the line, and the depth of the line, is adjustable by adjusting the overlap of each ovoid region formed during deposition of the line. For example, if the second ovoid region 406 of FIG. 7 is formed by moving the center of the ovoid by ⅕ the long dimension D of the ovoid, then ten scallops will result per ovoid region length, along the length of the line. If the second ovoid region is formed such that its center overlaps the end of the first ovoid region 402, and the number of scallops in the line per length D of the ovoid region is two. Likewise, in the later scenario, the depth of the line, except at the beginning and end (first and last ovoid, will be two or more deposition layers thick, whereas in the first scenario, it will be ten or more deposition layers thick, where each layer may be as thin as one atom. Thus, to form a smoother sidewall, using the ovoid projection for reaction, the length adjustment of the ovoid must be smaller, and the resulting line will be thicker, but the writing time will be longer. However, as the likely desired thickness of the line may be significantly thicker than ten or more atoms thick, the overall throughput where multiple lines need be overwritten will not suffer.

Additionally, as will be described further herein, during the writing of the line 420, only one, or both of the beams 40, 50 may be pulsed, i.e., intermittently directed to the writing area of the line. For example, one beam 40 may remain on, and move along the substrate in the path of the line 420, and the second beam 50 may be intermittently provided, at the time when the first beam 40 has reached the proper overlap position with a previously deposited ovoid region. The beam 50 may be pulsed by blanking the beam 50 off of the line 420 being written to another area of the substrate which is not occupied by another beam, or completely off of the wafer, and even by a shutter at the beam source. Alternatively, both beams may be pulsed, such that as the support 310 moves the substrate 320 laterally or in the z direction, the beams 40, 50 are both "off" until the next writing position for deposition of an ovoid region is attained, and they are then pulsed at the writing location. Again, off includes blanking the beams to non-overlapping locations on the substrate, within the chamber, or with a shutter at the beam source.

Referring now to FIGS. 9 and 10, there is shown an additional embodiment, where the apparatus of FIG. 8 is modified for etching, or "photonic" removal processes. In this embodiment, the two beams 40, 50 are overlapped, such that the centerlines of the two beams are parallel and offset from one another, such that an overlap region 1000 (FIG. 10) is formed which extends collinearly of both beams 40, 50 in the overlap region thereof, to form the ovoid overlap region of the two beams 40, 50 shown in FIG. 4. In contrast to the embodiment of FIG. 6, in this embodiment, the overlap region extends the height of the chamber, and thus the reaction of the etchant reactants will occur along the length of the overlap region.

Referring now to FIGS. 11 to 13, the effect of an etching reaction using the overlapped beams 40, 50 is shown. In this case, beam 40 extends over the substrate by width 40a, and beam 50 extends over the substrate by width 50a, with an overlap region 52 extending as an ovoid column from the substrate 320 and having the cross-section shown in FIG. 4. As shown in FIG. 11, a partial view of substrate 320 includes a silicon oxide layer 322 formed thereon, through which a feature 324 (FIG. 13) is desired to be formed. The feature 324 to be etched has a width 326 on the order of less than 20 nm wide, for example 5 nm wide. To etch this feature, the chamber 300 of FIG. 9 is pumped down to the millitorr range by exhaust 368, and argon or another inert background gas is introduced through gas port 366, until a stable pressure is reached. Then an etchant selective to silicon oxide is introduced through port 362, such that the gaseous reactant overlies the substrate 320. Then beams 40 and 50 are activated, to etch the layer 322.

After a first etch step, the silicon oxide layer 322 has a small recess 328 formed therein, which extends to a depth equal to the quantity of $SiO_2$ molecules that can be etched with the quantity of etchant activated by the energy of the overlying beams during the period both beams are on in the overlapping region 52. A reactant, such as $CF_4$, may be used to etch the underlying silicon oxide. Because the $CF_4$ will receive sufficient energy to be activated only in the region of the beam overlap 52, etching of the silicon oxide with the F activated from the $CF_4$ will also occur only in, or very close to, the ovoid region where the overlap ovoid meets the silicon oxide layer 323, and thus the recess 358 will have the same dimension and profile as that in the overlap region 52.

Referring to FIG. 11, after the etching process of FIG. 11 has been repeated a number of times, the recess 352 is deepened, and it has sidewalls 358a extending generally perpendicular to the exposed face 326 of the silicon oxide layer 352, and a base 358d. Then, as processing continues, the recess 358 eventually extends through the silicon oxide layer to form feature 324. To form a circular recess having the width of the long dimension D of FIG. 6, the substrate or the beams may be rotated about the center of the etched feature. Alternatively, to provide a more rounded feature, the substrate may be moved in a small, on the order of nanometers sized, circular, trapezoidal, pentagonal, etc. pattern to cause rounding of the etched feature.

Preferably, in the etching embodiments herein, at least one of the two beams is pulsed, such that, for example, beam 40 is maintained "on" the substrate 320, and the second beam 50 is pulsed on and off. The pulsing of the second beam 50 enables the byproducts of etching to clear the etched feature before the next pulse forms more activated etch species for further etching of the silicon oxide or other layer to be etched. Additionally, the first beam 40 may raster scan the substrate by having the substrate support 320 move in the x and y directions, and this multiple locations on the substrate 320 may be etched. For example, a second feature may be etched adjacent the initial location, such as where recess 328 shown in dashed lines in FIG. 11 is located. The adjacent feature may be formed by moving the beam 40 back and forth between the two different locations, and pulsing the second beam 50 when the beam 40 is in a process position.

The beams 40, 50 are shown in an adjacent, overlapped, parallel relationship in FIG. 9, so that directional etching of the feature 324, with sidewalls generally perpendicular to the face of the silicon oxide or other etched layer, may be accomplished. If the 40, 50 beams only intersect at the layer 330 being etched, as is shown in FIG. 14 they will be shadowed from the base of the recess 358d by the layer being etched, and the resulting beam overlap area 374 will be shrunken by the adjacent area 372 of the film layer, resulting in a conical profile of the etched feature. Thus, unless a very shallow feature is being etched, the two beams 40, 50 should be provided in a parallel, adjacent overlapped configuration of FIG. 9.

The example for etching shown in FIGS. 9 to 13 is described in terms of etching a three dimensional recess having the cross section of the overlap region of the two beams. To etch a line, the same procedure as was described for writing/depositing a line with respect to FIGS. 6 to 8 may be followed, with the caveat that the parallel, adjacent overlapped beams of be used. Likewise, to write/deposit a pillar having the overlap profile of the two beams, the overlapped beams may remain at a single spot on the substrate, and the substrate may be moved in the z direction to sequentially form atomic size layers of deposition material thereon.

FIG. 15A shows a schematic arrangement of a system for obtaining a multitude of individual depleted beamlets, as opposed to the individual beams 40, 50 of FIG. 6. The individual depleted beamlets are supplied directly from an excitation and a depletion source laser. In this embodiment, a substrate 320 is shown, and it is held, and moveable in at least an x, a y and a z direction as was described with respect to FIG. 6. In this embodiment, a depleted source beam 1500, and a depleted source beam 1502, each provided by combining an excitation beam and a depletion beam as described herein with respect to FIGS. 3 to 5, are each divided into individual beamlets 1500 a-n and 1502 a-n, only two of each are shown in FIG. 15. In this embodiment, the beamlets 1500a-n and 1502a-n are derived from a depleted beam, such that each beamlet has the profile of the beam 32 of FIGS. 3 and 4B, each of the beamlets 1500a-n has the same photon energy, and each of the beamlets 1502 a-n has the same photon energy. Also, individual pairs of beamlets, where one of the pair is from the beamlets 1500a-n and one of the pair is selected from beamlets 1502a-n, are combined to create overlap ovoid regions as shown in FIG. 4. In this embodiment, the number of beamlets 1500a-n is equal to the number of beamlets 1502a-n, such that the number of ovoid overlap regions of beamlets is n.

To form the beam lets, a description of forming beamlets 1500n is given, and the same construct is used to form the beamlets 1502 a-n. Beam 1500 is directed to a through a two dimensional Fourier grating system 1504 from which a plurality of beamlet elements are emitted. Each beamlet element may be passed through an additional two dimensional Fourier grating, and each subsequent beam through a further two dimensional Fourier grating, until a large number on the order of 1000 or so beamlets are formed. The individual beamlets are parallel with one another into infinity. Each of the resulting beamlets 1500a-n, only 1500 a and n shown in FIG. 15, are directed at a micro-mirror array 1510, having a plurality of micro-mirrors 1500 a-n equal or greater in number than the beamlets 1500 a-n, and each micro-mirror 1500 a-n is individually controlled, via a controller 1520, to either reflect the beamlet reflected thereby to a position to create an overlap region with a beamlet 1502a-n emanating from beam 1502 on the substrate 320 or to a location off the substrate 320 or on the substrate but not in an overlapping relationship with another beam let.

Referring now to FIGS. 16 and 17, the micro-mirror array 1510 is shown in further detail. As shown in FIG. 16, individual mirrors 1510a, et. seq. are laid out in a rectangular array, and each of the mirrors 1510a-n are individually controlled to actuate about the z direction as shown in FIG. 17, to position the mirrors 1510a-n to either direct the individual beamlets 1500a-n to a specific location to overlap a beamlet 1502a-n, or in a second position to direct the individual beamlet 1500a-n off the substrate. As shown in FIG. 17, the micro mirrors 1510d, f, g are positioned to direct the beam in the direction of a substrate 320 (FIG. 15A), and mirror 1510e is moved relative to the position of mirrors 1510d, f, g to locate beamlet 1500e off of the substrate 320.

As previously discussed, beam 1502 is split by one or more Fourier gratings in a Fourier grating system 1504 dedicated therefor, and the individual resulting beamlets 1502a-n are directed at individual micromirrors of a micromirror array 1510, to be directed to a discrete overlap location with a dedicated beamlet of beamlets 1500a-n. Where the system is desired to be run in a deposition mode, i.e., where a deposition precursor gas such as silane is introduced into the chamber to form a silicon deposit in the ovoid overlap regions formed by overlapping pairs of beamlets 1500 and 1502, the second micro-mirror array 1510 and controller 1520 associated with beamlets 1502a-n may be disposed of and replaced with a separate mirror, and the beamlets 1502a-n may remain oriented in the direction of the substrate 320 throughout the deposition process.

To form features on the substrate surface, for example by deposition, each of the pairs of beamlets, for example beamlets 1500a and 1502a, are configured to create an overlap region at a specific coordinate location in the x, y and z coordinates of the chamber 300, i.e., an overlap region in space, which, when the substrate is properly located in the z direction, the overlap region is projected onto the substrate 320.

FIG. 15B is a schematic representation of an optical system 15000 that may be used to generate a pattern of overlapped depleted beamlets having single-nanometer dimension. The pattern may be a regular, repeating pattern, or the pattern may be a selective pattern, with individual overlapped depleted beamlets switched "on", meaning having sufficient energy to activate a chemical reaction, or switched "off", meaning not having sufficient energy to activate a chemical reaction. The optical system 15000 may be used with any of the apparatus described elsewhere herein for performing a deposition or etch process. FIG. 15B generally shows three beamlets to represent an array of beamlets that may have thousands, millions, or even billions of beamlets.

The substrate 320 is processed using the optical system 15000, which comprises two optical subsystems 15501 and 15502. Each of the optical subsystems 15501 and 15502 produces an array of depleted beamlets. A first optical subsystem 15501 produces a first array of depleted beamlets 15901 and a second optical subsystem 15502 produces a second array of depleted beamlets 15902. The first and second arrays of depleted beamlets 15901 and 15902 are combined or overlapped using a beam splitter 15921 to form an array of overlapped depleted beamlets 15941. The array of overlapped depleted beamlets 15941 is focused, magnified, or demagnified by a first imaging element 15961, which may be a first lens, and by a second imaging element 15981, which may be a second lens, to form an image array of overlapped depleted beamlets 15991 that is directed to the substrate 320. Depending on the exact alignment at the beam splitter 15921 of the beamlets produced by the two optical subsystems 15501 and 15502, the beamlets may partially overlap, meaning a boundary of the energy field of each beamlet, for example the 1/e intensity boundary of each beamlet, intersects; the beamlets may fully overlap, meaning the energy field boundary of one beamlet is entirely inside that of the other beamlet; or the beamlets may be combined, meaning the optical axes of the two beamlets coincide and are parallel within the accuracy of any reasonable measurement.

The first array of depleted beamlets 15901 is produced by directing a first incident radiation beam 15521 of selected wavelength and intensity to a first diffractive optical element 15561. A first depletion beam 15541 is also directed to a second diffractive optical element 15581. The first incident radiation beam 15521 is divided into a first array of beamlets 15601 by the first diffractive optical element 15561, and the first depletion beam 15541 is divided into a first array of depletion beamlets 15621 by the second diffractive optical element 15581. The beamlet arrays 15601 and 15621 are arranged to coincide at a point on, or within, a first beam splitter 15641 to form a first array of depleted beamlets 15561, in which substantially all beamlets of the array 15601 are combined with a depletion beamlet from the array 15621. The first array of depleted beamlets 15661 emerges from the first beam splitter 15641 and is directed to a first collimating element 15681 to produce a first array of collimated depleted beamlets 15701. Some electromagnetic radiation may also propagate out of the optical system 15000 at the first beam splitter 15641. The first array of collimated depleted beamlets 15701 passes through a focal element 15721 to form a focused array of depleted beamlets 15741, which is directed through a second beam splitter 15761 and a second collimating element 15861 to a first addressable micro-mirror array 15841, substantially as described in connection with FIGS. 15A, 16, and 17 above. Some electromagnetic radiation may also propagate out of the optical system 15000 at the second beam splitter 15761. The first addressable micro-mirror array 15841 selectively reflects depleted beamlets back through the second collimating element 15861, depending on the orientation of the individual reflecting elements of the array 15841, as determined by a controller configured to address and adjust each reflecting element individually. The second collimating element 15861 focuses the reflected beamlets back to the second beam splitter 15761. Beamlets reflected from the second beam splitter 15761 form a patterned array of depleted beamlets 15871, reflecting the configuration of the first addressable micro-mirror array 15841. Beamlets that were reflected from the first addressable micro-mirror array 15841 confer additive energy the patterned array of depleted beamlets 15871, such that the pattern array of depleted beamlets 15871 may contain depleted beamlets of a first energy and depleted beamlets of a second energy different from the first energy. The patterned array of depleted beamlets 15871 is directed through a third collimating element 15881 to form the first array of depleted beamlets 15901 bearing the energy pattern defined by the addressable micro-mirror array 15841.

A similar process is performed to form the second array of depleted beamlets 15902 using the second optical subsystem 15502, which is similar or identical to the first optical subsystem 15501. A second addressable micro-mirror array 15842 may be used to pattern the second array of depleted beamlets 15902. At least one of the arrays 15901 and 15902 has a pattern of beamlet energies that may have depleted beamlets of two different energy values. If both beamlet arrays 15901 and 15902 are patterned according to energy, the two patterns may be the same or different. Thus, the image array of overlapped depleted beamlets 15991 may be configured to have overlapped energy fields at the surface of the substrate 320 that have one, two, or four different energies. It should be noted that the beam splitters used in the optical system 15000 may result in some power losses through the system, so the power level of the original incident beams and depletion beams are selected to compensate for those losses.

Depending on the precursors present in the energy fields, such an optical system may be used to concurrently perform deposition and etching processes at different locations on one substrate. For example, the image array of overlapped depleted beamlets 15991 may be arranged, by operation of the addressable micro-mirror arrays 15841 and 15842, to deliver a plurality of overlapped energy fields having four different energies to the substrate 320 such that a first portion of the overlapped energy fields has an energy that activates a deposition precursor provided to the substrate in a gas mixture, a second portion of the overlapped energy fields has an energy that activates an etch precursor provided to the substrate in the gas mixture, and a third portion of the overlapped energy fields has an energy that does not activate any precursors. In this way, a first plurality of locations on the substrate 320 undergo a deposition process, a second plurality of locations on the substrate 320 undergo a concurrent etch process, and a third plurality of locations on the substrate 320 are not processed. For example, if a gas mixture comprising silane and $CF_4$ is provided to a chamber with the optical system 15000 of FIG. 15B, a substrate may be processed by performing thousands of single nanometer-sized deposition processes at a first plurality of locations on the substrate using energy that is selected to activate only the silane, while concurrently performing thousands of nanometer-sized etch processes at a second plurality of locations on the substrate, different from the first plurality of locations, using energy that is selected to activate only the $CF_4$, and all the energy for activating the precursors is emitted concurrently by four radiation sources through the optical system 15000. In this way, a deposition process may be performed at a nanometer-sized location on the substrate while, concurrently and only about 40 nm away, an etch process is performed at another nanometer sized location on the same substrate.

A similar method and apparatus may be used to selectively remove material from a semiconductor substrate. The semiconductor substrate may be disposed in a processing chamber, where a pattern of overlapping depleted beams or beamlets is directed to the substrate. Concurrently, a selective removal gas such as HCl or $Cl_2$ may be provided to the processing chamber at an area adjacent to the substrate. The wavelength, intensity, and duration of the radiation of the beams or beamlets is selected to activate the selective removal gas to a reactive state so that activated species of the selective removal gas react with species on the substrate that are to be removed.

FIG. 15C is a schematic representation of an optical system 15001 according to another embodiment that may be used to generate a pattern of overlapped depleted beamlets having single-nanometer dimension. The optical system 15001 uses properties of radiation to collinearly combine or overlap beams of electromagnetic radiation, reducing power losses that might be encountered using the optical system 15000 of FIG. 15B. A first incident beam or pulse 15523 is passed through a first diffractive optical element 15563 to form a first array of beamlets 15603, which are passed through a first collimating element 15683 to form a first collimated beamlet array 15703. A first polarizer 15703 polarizes the beamlets of the first collimated beamlet array 15703 to form a first polarized beamlet array 15763.

A second incident beam 15543 is likewise passed through a second diffractive optical element 15583 to form a second array of beamlets 15623, which are passed through a second collimating element 15693 to form a second collimated beamlet array 15713. The second collimated beamlet array 15713 is passed through a second polarizer 15743 to form a second polarized beamlet array 15783.

The first polarized beamlet array 15763 and the second polarized beamlet array 15783 have polarization states that are related in a way that they can be collinearly combined by a first polarized beam combiner 15803. The polarization state of the first polarized beamlet array 15763 may be orthogonal to the polarization state of the second polarized beamlet array 15783. The first polarized beamlet array 15763 and the second polarized beamlet array 15783 are aligned such that each beamlet of the first polarized beamlet array 15763 is substantially coaxial and parallel to a corresponding beamlet of the second polarized beamlet array 15783 as the two beamlet arrays exit the first polarized beam combiner 15803, by aligning each corresponding beamlet from each array as closely as possible to hit exactly the same spot on an optically active surface 15813 of the polarized beam combiner 15803. The resulting array of combined beamlets 15823 thus comprises a plurality of beamlets, each of which may have a Gaussian energy profile similar to that described in connection with FIG. 1B. Alternately, the two beamlets arrays may be aligned so that each beamlet of one beamlet array overlaps with a corresponding beamlet of the other beamlet array to form an array of overlapping beamlets, each of which may have an every profile similar to that described in connection with FIG. 1C. To form an array of overlapping depleted beamlets having an overlap pattern as shown in FIG. 4, the first and second polarized beamlet arrays 15763 and 15783 may be slightly mis-aligned at the first polarized beam combiner 15803.

An array of depletion beamlets 15824 may be formed in a substantially similar manner using the optical subsystem 15504, which is similar or identical to the optical subsystem 15503. A first depletion beam 15524 and a second depletion beam 15544 are divided into beamlets by a third diffractive optical element 15564 and a fourth diffractive optical element 15584, respectively. The beamlets are collimated and polarized such that a second polarized beam combiner 15804 combines the beamlets to form the array of depleted beamlets 15824, each beamlet thereof having an energy profile similar to that described in connection with FIG. 2B. To form an array of overlapping depleted beamlets having an overlap pattern as shown in FIG. 4, first and second polarized depletion beamlet arrays 15764 and 15784 may be slightly mis-aligned according to the same pattern as the mis-alignment of the first and second polarized beamlet arrays 15763 and 15783. Then, the resulting array of depletion beamlets 15824 is aligned with the slightly mis-aligned array of beamlets 15823 so that each depletion beamlet coincides with a corresponding beamlet from the array 15823, as described in connection with FIG. 3A. The overlap in the depletion beamlets and the normal beamlets described above, when combined in this way, results in overlapped depleted beamlets.

The array of beamlets 15823 may be collinearly combined with the array of depletion beamlets 15824 by using a wavelength selective reflector 15922. Such a reflector reflects electromagnetic radiation of one wavelength, or a narrow band of wavelengths, while transmitting electromagnetic radiation of other wavelengths. Such reflectors are known in the art, and may be made by forming alternating layers of materials having different refractive indices. The materials may be selected, and the thicknesses of the layers may be determined, to provide virtually any desired degree of wavelength selectivity. In the embodiment of FIG. 15C, the depletion beams 15544/15524 may have a different wavelength from the incident beams 15523/15543. The wavelength selective reflector 15922 is configured to reflect electromagnetic radiation at the wavelength of the depletion beams 15544/15524. Aligning the depletion beamlet array 15824 with the beamlet array 15823 on the wavelength selective reflector 15922 results in a collinearly combined array of depleted beamlets 15942. The array 15942 may finally be focused, magnified, or demagnified by the imaging optical elements 15962 and 15982, which may be imaging lenses, to form an image of overlapped, depleted beamlets at the substrate 320. It should be noted here that the optical system 15001 may also be configured with a wavelength selective reflector 15922 that reflects the wavelength of the incident beams 15523/15543 while transmitting the wavelength of the depletion beams 15524/15544.

FIG. 15D is a schematic representation of an optical system 15002 according to another embodiment that may be used to generate a pattern of overlapped depleted beamlets having single-nanometer dimension. The optical system 15002 is similar in most respects to the optical system 15001 of FIG. 15C, except that the addressable micro-mirror arrays 15841/15842 described in connection with FIG. 15B are included. The polarizers 15743/15744 are moved to the opposite side of their respective polarized beam combiners 15803/15804 so the respective beamlets arrays 15783/15784 will pass through the polarizing beam splitters 15803/15804 at first, be polarized by the polarizers 15743/15744, and reflect from the addressable micro-mirror arrays 15841/15842.

In an alternate embodiment, 15543 and 15524 may be incident beams and 15523 and 15544 may be depletion beams. In such an embodiment, the two incident beams 15543/15524, divided into beamlet arrays 15713/15714 may be digitized (i.e. individual beamlets switched on or off) by the addressable micro-mirror arrays 15841/15842, and the resulting patterned beamlet arrays combined with depletion beamlet arrays using polarization. The resulting digitized depleted beamlet arrays 15823/15824 may then be combined or collinearly overlapped using the wavelength selective reflector 15922. In such embodiments, the wavelength selective reflector 15922 may selectively reflect the two wavelengths of the incident beam 15524 and the depletion beam 15544. In such an embodiment, the wavelengths of the incident beams 15543/15524 are preferably different and the wavelengths of the depletion beams 15523/15544 are preferably different to facilitate combination or overlap at the wavelength selective reflector 15922. Such reflectors are known in the art, and may be made by applying two Bragg coatings to a substrate, each selective to one wavelength. Thus, a first wavelength is reflected by the first coating and a second wavelength is reflected by a second coating, the two wavelengths corresponding to the incident and depletion beams 15524/15544. Note that the differing path lengths of the two beams, due to the different penetration depths into the wavelength selective reflector 15922, may be addressed by adjusting alignment of the beamlet arrays 15714 and 15764.

As described above in connection with FIG. 15B, such a configuration may be used to make an array of overlapped depleted beamlets 15992 at the surface of the substrate 320 that has a variety of beamlet energies. FIG. 15E is a view of a portion 15900 of the substrate 320 with the array of overlapped depleted beamlets 15992 illuminating the surface thereof. The array 15992 comprises a first plurality of overlapped beamlets 15902 having a first energy and a second plurality of overlapped beamlets 15904 having a second energy different from the first energy. The first energy may be an energy that activates a first precursor to perform a first process at the surface of the substrate 320 in the areas illuminated by the first plurality 15902. The second energy may be an energy that activates a second precursor to perform a second process at the surface of the substrate 320 in the areas illuminated by the second plurality 15904.

The two different energies may be realized by operation of the addressable micro-mirror array 15841 such that a selected beamlet from the array 15783 is not returned through the polarizer 15743. The result at the corresponding location on the wafer 320 is that the irradiated area of the substrate is illuminated by radiation only from the incident beam 15523 without any contribution from the incident beam 15543, resulting in radiation of lower energy than if both incident beams 15523/15543 are combined. In this way, adjacent locations on the substrate 320 may be illuminated by radiation from one incident beam or from two overlapping incident beams.

Precursors may be provided to the substrate 320 in a single gas mixture such that wherever the gas mixture encounters the first energy, the first precursor is activated and wherever the gas mixture encounters the second energy, the second precursor is activated. Each of the first and second precursors may independently be a deposition precursor or an etch precursor so that the first process may be a deposition process or an etch process and the second process may be a deposition process or an etch process. In this way, beamlets having dimensions less than 10 nm may be directed to the surface of the substrate 320 in a substantially perpendicular and collimated fashion to perform precise material processes avoiding the shadowing phenomenon described in connection with FIG. 14.

In some embodiments, the second energy may activate both the first and the second precursors. In such embodiments, the concentration of the first and second precursors in the gas mixture may determine the nature of the process performed by the combined activated first and second precursors. If the first precursor is a deposition precursor and the second precursor is an etch precursor selective to species deposited from the first precursor, then the equivalent amounts of the first and second precursors determine whether the process activated by the second energy is an etch process or a modified deposition process. If the etch precursor is in substantial excess, an etch process may result. If the etch precursor is not in substantial excess, a modified deposition process, such as a selective deposition process (e.g., a process in which the etch rate of the activated etch precursor is faster in some areas than in others), may result.

In some embodiments, the wavelength of the incident beams 15543 and 15524 of FIG. 15D may be selected based on absorption cross-section of two precursors provided to the chamber in the gas mixture. In such embodiments, overlapped depleted beamlets may be directed to the substrate that have three different energies. The first energy may have a first wavelength, the second energy may have a second wavelength, and the third energy may have a combination of the first and second wavelengths. The first wavelength may be preferentially absorbed by the first precursor and the second wavelength may be preferentially absorbed by the second precursor. The fluence of each laser may be further selected, along with concentration of the precursors, to achieve specific levels of activation of each precursor at specific locations on the substrate to perform highly selective material processes in areas smaller than 10 nm, in some cases smaller than 1 nm, and separated by 20 nm or less concurrently. In such embodiments, the wavelength selective reflector 15922 may be selective to more than one wavelength. Such reflectors may be made by forming a dual-wavelength selective reflecting layer on a transmissive substrate, the layer comprising a first layer selective to a first wavelength and a second layer selective to a second wavelength, the different wavelengths being determined by the refractive indices and thicknesses of the layers deposited on the substrate.

Figure 18F:
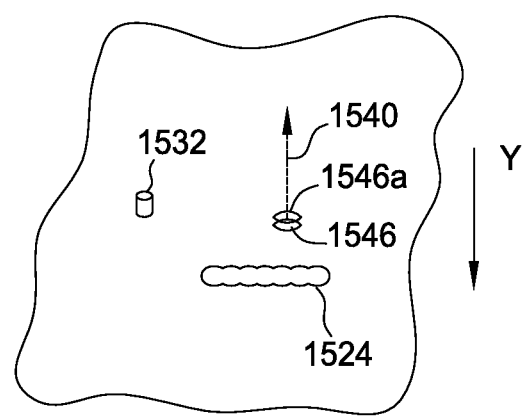

Referring to FIGS. 18A to 18F, the deposition of two lines and a pillar on a portion 1530 of the surface of substrate 320 is shown. Referring first to FIG. 18A, the surface 1530 of the substrate 320, without the lines or pillars is shown. Then, as shown in FIG. 18B, three ovoid overlap regions, 1532, 1534 and 1536 are formed on the substrate surface, corresponding to locations 1542, 1544 and 1546 on surface 1530. Then, by applying the silane precursor as previously described a silicon deposition layer in the contour and size of the ovoid regions is formed. Ovoid overlap regions 1532-1536 are locations fixed three dimensionally in the chamber 300, whereas the locations 1542-1546 are locations fixed on the surface 1530 of the substrate 320.

Referring now to FIG. 18C, there is shown the deposited ovoid features that were deposited in FIG. 18B at locations 1542-1546, but only ovoid region 1532 is formed on the substrate 320, over the previously deposited material at location 1542, such that an additional layer of material is formed over the previously formed material at location 1542. The ovoid regions that formed deposition material at locations 1544 and 1546 are not present, which occurs because beamlets 1502 and or 1500 used to form an overlapping region at those location were diverted by the micromirrors associated therewith in the micro-mirror array 1510.

Referring now to FIG. 18D, the substrate is shown with a plurality of deposition layers stacked one atop the other at location 1542, which were formed by repeating the process described with respect to FIG. 18C, and an overlap region 1534 is shown projected onto the substrate 320 adjacent to the previously formed layer at location 1544. This is accomplished by moving the substrate to the left in the figure, such that the ovoid region having fixed coordinates in the chamber appear to the right of the previously deposited ovoid layer at location 1544. At this point reactant gas is introduced, or is already present, to form a deposition layer at location 1544a adjacent to, and overlapping, location 1544. Then, as can be seen in FIG. 18E, the substrate 320 movement and pulsing of one or both of the beamlets 1500a-n, 1502a-n dedicated to ovoid region 1534 has resulted in a plurality of ovoid deposition regions extending from location 1544 to 1544n on the substrate surface 1530 to form a line extending from the right to the left in the Figure.

Referring now to FIG. 18F, the substrate 320 has now been moved in the Y direction, perpendicular to the direction in which the substrate 320 was moved to form the line 1534, and only ovoid region 1536 is projected on the surface 1530, such that the ovoid projected region 1536 overlies, and extends in the Y direction from, the film layer formed at location 1546. As demonstrated by dashed line arrow 1540, a line 1536 may be written in the Y direction by further incremental movements of the substrate 320 in the Y direction followed by forming the ovoid region 1536 to form a yet further partially overlapping, partially extending, ovoid deposition layer on previously formed layer 1536a . . . , until a line of a desired thickness is written. To extend the height of the lines 1544 and 1546 in the Z direction of FIG. 6, the lines 1546 and 1544 are overwritten using the same sequence of operations as described.

To enable selective projection of the beamlets to form pillars and lines, the controller 1520 includes a programmable microprocessor and interface software configured to bend each or any of the micro-mirrors of the micromirror array 1510 following an instructed patter to write pillars and lines across the entire surface 1530 of the substrate 320. Multiple lines, and multiple pillars may be written simultaneously, resulting in significant throughput in line writing by the system. Additionally, by proper simultaneous x and y direction movements, lines extending in directions other than parallel to the x or Y directions may be written. Additionally, to maintain a consistent size of the projection of the ovoid region on the substrate, the substrate may also be moved in the z direction where a material layer is being deposited over a pre-deposited film layer.

Referring now to FIGS. 17 and 19, a second configuration for projecting overlapping regions of two depleted beams is shown. In this embodiment, two separate depleted beams 1500 and 1502 are passed through Fourier grating systems 1504 to form multiple derivative beamlets 1500a-n and 1502a-n, and these beamlets are, as described with respect to FIG. 15, directed at, and selectively individually reflected in a first direction or a second direction, by a controller 1520 controlling the position of the mirror. However, in contrast to the embodiment of FIG. 15, in this embodiment, the individual beamlet 1500 and 1502 pairs to form the overlap regions on the substrate 320 are delivered to the wafer with a partial overlap and in a nearly collinear alignment, where the axes of each beamlet is parallel in infinity, or near infinity (beam spacing is maintained along the length of the beamlets). To provide this alignment, a beam combiner 1560 is provided where the beamlets 1502a-n pass through the combiner 1560, and the beamlets 1500a-n are reflected at the combiner 1560 in the direction of the substrate and nearly collinearly aligned, and parallel to, the beamlets 1502a-n, such that each pair of beamlets, for example beamlets 1500a and 1502a, have the alignment show and described with respect to beams 40, 50 of FIG. 10 herein.

In this configuration, etching or deposition of the species on the substrate 320 surface is accommodated. Because the beams are directed parallel to, and partially overlapped with, one another, the overlap region extends from the substrate 320 to the window 350 in the chamber 300, and the combiner is located exteriorly of the chamber 300.

In the same manner as described with respect to FIGS. 18A to 18F, the beamlets may be used to deposit features on the substrate surface using selective reflecting of beamlets to or from specific locations in the chamber 300. However, as the overlap region of each pair of beamlets extends the height of the chamber 300 above the substrate, the location of the overlap region may be considered fixed only in the x and y direction of the substrate because movement of the substrate in the Z direction (FIG. 6) will not result in a change in the size of, or complete loss of, the overlap regions on the substrate. Additionally, this embodiment is highly desirable for etch processes, as the overlap region is columnar and will not be shadowed from the base of a feature being etched would occur with the beamlets of FIG. 15.

Referring now to FIG. 20, a sheet beam arrangement for photonic processing of a workpiece is described. A sheet beam projector 1600 of this embodiment replaces the two dimensional Fourier Grating 1504 of the previous embodiment shown and described with respect to FIGS. 15 to 17. In this embodiment, a depleted beam 1602 having an excitation region of high energy photons having a distinctive skirt or waste which is depleted, as is also shown and described with respect to FIGS. 3A and B herein, is directed through a first plano-convex lens 1604 and a first plano-concave lens 1606 to form an expanding sheet 1608, and then redirected into the sheet beam 1610 by passing through a second plano concave lens 1612 and second plano-convex lens 1612. A linear or line configured plurality of micromirror array 1620 is located in the line of sheet beam 1610, at a 45 degree angle with respect thereto, such that the sheet beam 1610 is transposed and reflected 90 degrees and thus in the direction of chamber 300. Chamber 300 has the same basic configuration of chamber 300 except where noted, so the description thereon will not be repeated. A single window 350, which has a length larger than the full width of the sheet beam, is disposed in the chamber lid 304. Thus, the sheet beam, which has a central excitation region of high energy photons and a depleted skirt or waste region to either side thereof, is projected into the chamber 300.

As described with respect to the Fourier grating 1504 and micromirror 1510 embodiment of FIGS. 15 to 17 herein, in this embodiment a second sheet beam projector 1600, and micromirror array 1620 are provided, and the sheet beam projected thereby is likewise directed to the workpiece 320, in a parallel, partially overlapping condition, such that a very narrow line, in which the overlap of the excitation beam portions of the two sheet beams overlap on the substrate. As with the previous embodiments wherein, it is contemplated that sheet beams having an excitation beam portion having high energy photons may be on the order of 50 or less nanometers wide, and as small as 20 nanometers wide, and an overlapping region, in which reaction will occur to reactant introduced or maintained over the workpiece, can be maintained below 20 nm wide, such as 5 nm to less than one nm wide.

Additionally, in this embodiment, as also described with respect to the embodiment shown in FIGS. 15 to 17, one of the sheet beams 1600 may be directed to the workpiece 320 by a unitary, i.e., a non micro mirror array 1620, mirror. As the presence of the two beams together at the workpiece is required for a reaction to occur, only one of the beams need be redirected or pulsed to effectively start and stop a reaction. Additionally, one beam may be configured as a depleted beam(s), and the second as a depleted sheet beam. Thus, by relatively partially overlapping the spot beam at discrete locations on the line on the substrate by the projected sheet beam, individual features may be formed in discrete locations over the length of the line of the projected sheet beam.

Referring now to FIGS. 21 and 22, the configuration of the micromirror array 1620 is shown. In contrast to the micromirror array of the previous embodiment, the micromirror array 1620 includes only a single row of mirrors 1620 a-n, and each mirror is individually addressable by a controller 1630 connected to an actuator on each of the micromirrors 1620 a-n by a communication line 1632. The positioning of each mirror of the micromirror array 1620 is the same as that shown in the micromirror array of FIG. 17, wherein the mirror may be maintained at a 45 degree angle to an incoming beam, or canted or rotated about a z axis (FIG. 21) to deflect the portion of the sheet beam 1610 reflected by the individual micromirror 320 a-n away from the workpiece 320.

Referring now to FIGS. 23 and 24, the use of overlapping excitation portions of two line beams 310 is shown. In FIG. 23, a workpiece 320 is disposed on support 310, which projects above the base of the chamber 300. An overlap region 1640 of two sheet beams extends across the workpiece as a thin line, and outwardly therefrom over the face of the support 310. The maximum length of the overlap region 1640 need be the width of the workpiece, and, the length of the linear overlap region 1640 may be adjusted by blanking the portions of the sheet beam with micromirrors at opposed ends of the micromirror array 1620. Then, by introducing (or maintaining a previously introduced) reactant species in the linear overlap region 1640, a feature 1650, created by the effect of the reactants, is formed over the overlap region 1640, as is shown in FIG. 24, wherein the workpiece has been rotated 90 degrees about its center 380. The feature 1650 can be a deposited feature, an etched feature, or other material feature, as have been previously described herein.

The workpiece may be moved in the x, y, z and theta directions shown on FIG. 23. Thus, after forming feature 1650, the substrate may be moved in the x direction, while at least one of the two sheet beams 1610 are blanked into a non-overlapping condition by the micromirror array 1620, and then the two sheet beams directed again to overlap at an overlap region 1640 to form a feature on or in the workpiece with a reactant. Thus, by moving the workpiece, and selectively blanking or not blanking portions of the sheet beam, continuous or discontinuous linear features may be formed on the workpiece, such as features 1650, 1650a and 1650b of FIG. 24.

After forming the linear features, the workpiece may be rotated, and again the two sheet beams caused to overlap at the workpiece in the presence of a reactant, to form additional continuous or discontinuous linear features across the overlap region, discontinuity provided by the selective blanking of individual ones of the micromirrors 1620 a-n by the controller 1630. As shown in FIG. 24, as a result of blanking of a portion of the micromirrors 1620 a-n, a discontinuous linear overlap region is formed on workpiece, having discrete overlap regions 1640 a-h. In the overlap regions, non-blanked micromirrors of the micromirror array 1620 project the portions of each sheet beam to the workpiece, but in the gaps in the linear arrangement of overlap regions 1640 a-h of FIG. 23, portions of at least one of the sheet beams 1620 are blanked by one or more of the micromirrors of the micromirror array 1620. The smallest length segment that may be discretely formed as an overlap is thus on the order of the size of an individual mirrors. Where the position of one set of micromirrors for one sheet beam is offset by one half the length of the individual micromirrors 1620 a-n, then the smallest length can be ½ the length of an individual micromirror, where the micromirrors in both arrays 1620 are the same.

Referring still to FIG. 23, the areas where the overlap sub regions 1640 a-h are formed will have a reaction occur with reactant. Thus, if for example the features 1650, 1650a and 1650b are lines formed by deposition from a precursor, then additional lines may be written or deposited on the workpiece 310 where the segments 1640 a-h of the overlap region are present. For example, a line may be written in overlap region 1640f between lines 1650 and 1650a. Alternatively, if an etching reactant for the previously deposited lines 1650, 1650a and 1650b is introduced as the reactant, then line 1650 can be etched away where overlap region 1640g extends thereacross. Thus, it is shown that by using sheet beams to create continuous or discontinuous linear overlap regions. Features may be deposited and etched to form lines, pillars, and the like, and materials may also be selectively etched to form apertures and trenches therein.

Referring now to FIG. 25, there is shown an electron energy diagram for a precursor to be used to enable reaction in overlap regions of the two depleted beams such as two STED depleted beams. A precursor useful in the operation of the depleted beam system of the present invention has the properties shown in FIG. 25, i.e., upon the receipt of the first beam $E_1$, the electrons in the atoms or molecules of the precursor move to an intermediate energy state, and in the skirt regions of the two overlapping beams, the electrons of the precursor move down from the intermediate state by exposure to the STED (depleted) beam $E_{1D}$ in the skirt region. Then, when the same atom or molecule is exposed to the second depleted beam $E_2$, the excited electrons which have remained at the intermediate state move to the antibonding state, and any electrons in the antibonding state that are exposed to the second depletion beam $E_{2D}$ (in the skirt region of the beam) move down from the antibonding state.

Once in the antibonding state, the atoms and molecules are highly susceptible to separation or reaction to form deposits or etch adjacent materials.

As described herein, the partially overlapping beams may be used for deposition and etching processes. Traditional deposition reactions, such as those in which two or more precursors combine to yield a deposition material, will occur in the overlap region to deposit a product of reaction within the area of beam overlap. Atomic layer deposition (ALD) processes may also be activated using the overlapping depleted beams hereof. In those reactions, any or all of the precursors used to form the deposition material may be activated to deposit on a substrate only in the overlap region. Thus, the initial (or an intermediate) precursor of a multi-precursor ALD process may be deposited by activation, and the subsequent precursors introduced to react therewith without the need for activation, and deposition will occur only at the sites where the initial (or intermediate) precursor was deposited. This may be repeated to form lines, pillars, etc., of a desired dimension. Where the initial precursor requires activation, there is no need to remove the initially (and intermediate, if needed) precursor from the non-reacted sites, because no reaction was activated at those sites.

This same paradigm may be used for atomic layer etching of an underlying substrate material. In one aspect, the first reactant precursor may be "blanket" deposited over the entire surface of the substrate, and the final reactive precursor may be that which is activated by overlapping beams, resulting in deposited or etched features only in the overlap region. The overlapping beams may be raster scanned over the material blanket deposited from the first precursor to form features at the desired locations.

As described herein, two different beams of photons are provided in a location such that the energy in the overlap region is a combination of the photon energy of both beams, the size of the overlap region may be selected as equal to (full overlap) or significantly smaller than, the cross section of either beam, and by introducing a precursor to the overlap region, a deposition or etching reaction can be caused to occur only in, or directly adjacent to the overlap region. Further, by employing depleted regions, wherein the effect to the photons in the skirt of the Gaussian profile of the beam is counteracted with a depletion beam, in one aspect a STED depleting beam surrounding an excitation beam, the occurrence of reaction outside of the overlapping area of the non-depleted center regions of the beams is prevented. Thus, as a beam having a non-depleted diameter as small as 20 nanometers may be formed, an overlap region as small as the single nanometer digits, or less than 1 nanometer, may be formed, such that very small features on a substrate may be formed therein.

Further, the embodiments herein contemplate using circular beams which, when partially overlapped, form ovoid regions. Other beam shapes, such as elliptical depleted beams, which when overlapped end to end will form a more circular overlap region, and rectangular depleted beams, which when overlapped corner to corner will form a rectangular overlap region, are specifically contemplated herein. Additionally, more than two beams may be combined and overlapped to form the reaction region. In this case, the ovoid region of FIGS. 18 may be modified to provide a three trilobular profile of the region using three partial overlapping beams. In this case the total energy of three beams, but not any two, is chosen to cause the deposition or etch reaction within the profile of the trilobular region.

Additionally, beam energies and reactants (precursors) may be chosen such that the combined energies of the beams are sufficient to cause the reactant to react for deposition or etch purposes, but the energy where the non-depleted excitation core of the beam overlaps the depleted region of the other beam will not result in deposition, thereby resulting in sharp definition of the resulting deposited or etched feature corresponding to the size and profile of the overlap region.

In general for the processes described herein, the excitation beam and/or the depletion beam may be continuous wave or pulsed beams. If the beams are pulsed, both the excitation beam and the depletion beam are energized and emitting radiation for a time period sufficient to excite species in a process gas, typically from about 500 nsec to about 1 msec, for example about 100 μsec to about 800 μsec. In addition, in a pulsed embodiment, the beams are typically de-energized between pulses for a time period less than a decay time, for example a half-life, of excited species in the process gas. Thus, the excitation and/or depletion beams will typically have a pulse frequency of about 500 Hz to about 20 MHz, for example 10 kHz to 50 kHz. The pulse duration and frequency depend on the composition, density, and temperature of the gases being activated. Smaller molecules directionally have larger ionization potentials and less likelihood of engaging in deactivating collisions at a given density and temperature. Higher densities make deactivating collisions more likely. Higher temperatures provide latent thermal energy to supplement the activating energy of the beams, leading to a lower excitation threshold.

The two excitation beams and the two depletion beams in an overlapped embodiment may all be pulsed at the same time, or the depletion beams may be pulsed with timing that encompasses the pulses of the excitation beams, so that the depletion beams are energized whenever the excitation beams are energized. In another embodiment, the depletion beams may be continuous wave while the excitation beams are pulsed. Embodiments where the depletion beams are energized for substantially longer times Additionally, although the embodiments herein have been described in terms of additive and removal processes, other processes are specifically contemplated where very fine features need to be defined or formed in a material. For example, the combined energies of proper energy may be used to expose photoresist to smaller feature sizing, well below the 20 nm cross section of a single depleted beam. Likewise, the combined beams may be used to activate a material such that later flowing of a gas or liquid thereover causes a reaction in the written area. They may be used for fine feature annealing, and for forming fine feature objects other than semiconductor device features, for example fine pith very thin lined gratings and the like.

While the foregoing is directed to embodiments of the present invention, other and further embodiments of the invention may be devised without departing from the basic scope thereof, and the scope thereof is determined by the claims that follow.

We claim:

1. A method of supplying reactant activation energy to a sub-micron area, comprising:
   providing a first photon energy beam having a central non-depleted region and a surrounding depleted region and a full width of about 40 nm;
   providing a second photon energy beam having a central non-depleted_region and a surrounding depleted region and a full width of about 40 nm; and
   positioning the central non-depleted region of the first photon energy beam and the central non-depleted region of the second photon energy beam to overlap in a first overlap region, wherein an area of the first overlap region is less than an area of either the central non-depleted region of the first photon energy beam or the central non-depleted region of the second photon energy beam.

2. The method of claim 1, further including:
providing a workpiece having a first and second work location on a surface of the workpiece,
positioning the workpiece so that the first overlap region extends over the first work location;
causing an energy-related effect to the first work location of the workpiece, and then
moving the workpiece relative to the first and second photon energy beams so that the first and second photon energy beams overlap in a second overlap region, wherein the second overlap region extends over the second work location.

3. The method of claim 2, wherein, during the movement of the workpiece, the first and second photon energy beams do not overlap.

4. The method of claim 1, further including pulsing at least one of the first and second photon energy beams.

5. The method of claim 2, wherein the second work location partially overlays the first overlap region.

6. The method of claim 1, wherein the first photon energy beam and the second photon energy beam are parallel and overlap along at least a portion of a length of each photon energy beam.

7. The method of claim 1, wherein the first photon energy beam and the second photon energy beam intersect at the first overlap region.

8. An apparatus for the formation of sub-micron features on a workpiece, comprising:
a first stimulated emission depleted beam generator;
a second stimulated emission depleted beam generator;
a moveable substrate support; and
optics defining a beam path between the moveable substrate support and the first and second stimulated emission depleted beam generators, wherein the optics include a blanking shutter.

9. The apparatus of claim 8, wherein the blanking shutter is a moveable mirror.

10. The apparatus of claim 8, wherein the blanking shutter is operable to cause a beam from the first or the second stimulated emission depleted beam generator to change between an overlapping condition and a non-overlapping condition at the moveable substrate support.

11. The apparatus of claim 8, wherein each stimulated emission depleted beam generator further comprises a beam splitter and a micromirror array.

12. The apparatus of claim 11, wherein at least one beam splitter comprises a Fourier grating.

13. The apparatus of claim 12, wherein the Fourier grating is a two dimensional Fourier grating.

14. The apparatus of claim 12, wherein the Fourier grating splits a beam from the respective stimulated emission depleted beam generator into a plurality of beamlets.

15. The apparatus of claim 14, wherein the optics further include a beam combiner positioned in the beam path between the micromirror arrays of the first and the second stimulated emission depleted beam generators, such that beamlets from the first stimulated emission depleted beam generator pass through the combiner, and beamlets from the second stimulated emission depleted beam generators are reflected at the combiner.

16. The apparatus of claim 15, further including a controller capable of independently moving each mirror of at least one of the micromirror arrays.

17. A method of causing a reaction at a sub-micron region of a substrate, comprising;
providing a first beam having a first excitation portion of a first energy level surrounded by a first depleted region;
providing a second beam having a second excitation portion of a second energy level surrounded by a second depleted region;
providing a third beam having a third excitation portion of the first energy level surrounded by a third depleted region;
providing a fourth beam having a fourth excitation portion of the second energy level surrounded by a fourth depleted region;
selectively partially overlapping the first excitation portion and the second excitation portion at a surface of the substrate to form a first reaction region having an area smaller than the projected area of either the first or the second excitation portion on the substrate;
selectively partially overlapping the third excitation portion and the fourth excitation portion at the surface of the substrate to form a second reaction region;
providing at least one reactant species at the first reaction region; and
performing a reaction involving the reactant species in the first reaction region but not in substrate regions adjacent to the first reaction region.

18. The method of claim 17, wherein the reactant species is a deposition or etching reactant.

19. The method of claim 17, wherein the first reaction region at least partially overlays the second reaction region, forming an overlay reaction region.

20. The method of claim 19, further including:
interrupting the passage of the first and third beams such that the first and third beams do not reach the substrate;
moving the substrate; and
causing only the first beam to again reach the substrate.

21. The method of claim 20, wherein moving the substrate occurs before the first beam again reaches the substrate.

22. The method of claim 20, further comprising, after moving the substrate, selectively partially overlapping the first excitation portion and at least one of the second excitation portion and the fourth excitation portion in the presence of the reactant to cause the reaction in the overlay reaction region.

* * * * *